United States Patent
Satoh et al.

(10) Patent No.: US 6,876,774 B2
(45) Date of Patent: Apr. 5, 2005

(54) METHOD AND APPARATUS FOR COMPRESSING DATA STRING

(75) Inventors: Noriko Satoh, Kawasaki (JP); Shigeru Yoshida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 155 days.

(21) Appl. No.: 10/230,236

(22) Filed: Aug. 29, 2002

(65) Prior Publication Data
US 2002/0196166 A1 Dec. 26, 2002

Related U.S. Application Data

(62) Division of application No. 09/348,163, filed on Jul. 7, 1999, now Pat. No. 6,563,956.

(30) Foreign Application Priority Data

Jul. 9, 1998 (JP) .......................................... 10-193832
May 28, 1999 (JP) .......................................... 11-150217

(51) Int. Cl.[7] .......................... G06K 9/36; G06K 9/72; H03M 7/38
(52) U.S. Cl. .......................... 382/245; 382/229; 341/51
(58) Field of Search .............................. 382/246, 245, 382/244, 232, 229; 341/51, 87, 61, 106, 90; 707/532

(56) References Cited

U.S. PATENT DOCUMENTS

| | | | |
|---|---|---|---|
| 4,071,745 A | | 1/1978 | Hall .............................. 700/16 |
| 5,016,009 A | | 5/1991 | Whitling et al. ................ 341/67 |
| 5,136,289 A | * | 8/1992 | Yoshida et al. ................. 341/67 |
| 5,155,484 A | | 10/1992 | Cahmbers, IV ............... 341/55 |
| 5,254,990 A | * | 10/1993 | Yoshida et al. ................. 341/51 |
| 5,389,922 A | * | 2/1995 | Seroussi et al. ............... 341/51 |
| 5,533,051 A | * | 7/1996 | James ......................... 375/240 |
| 5,635,932 A | * | 6/1997 | Shinagawa et al. ............ 341/51 |
| 5,951,623 A | * | 9/1999 | Reynar et al. ................ 708/203 |

FOREIGN PATENT DOCUMENTS

JP 05113869 A * 5/1993 ............. G06F/5/00

OTHER PUBLICATIONS

"Multiple–Dictionary Compression Using Partial Matching," Hoang, D.T. et al., Proceeding of Data Compression Conference, 1995, pp. 272–281.*
"Highly Efficient Universal Coding with Classifying to Subdiictionaries for Text Compression," Kakano, Y. et al., Proceeding of Data Compression Conference, 1994, pp. 234–243.*
Williams, Ross N., "An xtremely Fas ZIV–Lampel Data compression Algorithm", pp. 362–371, 1991.

* cited by examiner

*Primary Examiner*—Wenpeng Chen
(74) *Attorney, Agent, or Firm*—Staas & Halsey LLP

(57) ABSTRACT

The present invention provides a data compression method in which a plurality of consecutive characters of a data string to be compressed are set as a character string to be searched for. Bits of a bit string representing the set character string are allocated to at least two codewords. Thus, first and second searching codewords are generated. These first and second codewords are used as array addresses. First and second array tables are prepared, in which information on the past occurrence positions of the set character string is previously entered as the contents thereof. When the first and second codewords are generated from the character string to be compressed, the first and second array tables are looked up by using these codewords as the addresses of the arrays. When results of looking up these tables match with each other, it is found that the set character string occurred in the past. Thus, information on the past occurrence position information of the set character string is obtained according to the obtained array content. Then, this information is encoded, so that data compression is performed. Thus, the amount of memory needed for the tables is significantly reduced, while information on the past occurrence position of the set character string is obtained without reducing a searching speed.

24 Claims, 17 Drawing Sheets

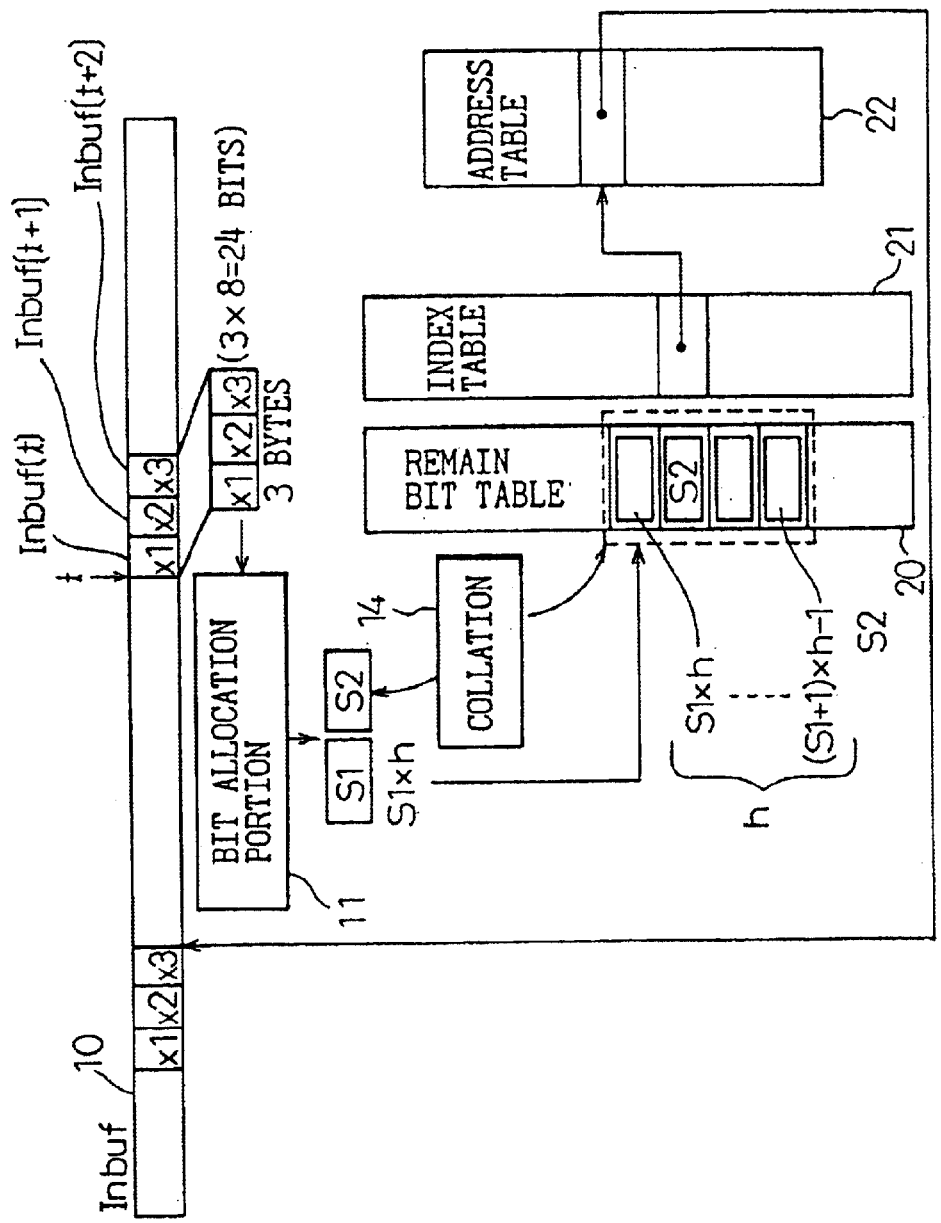

Fig.13
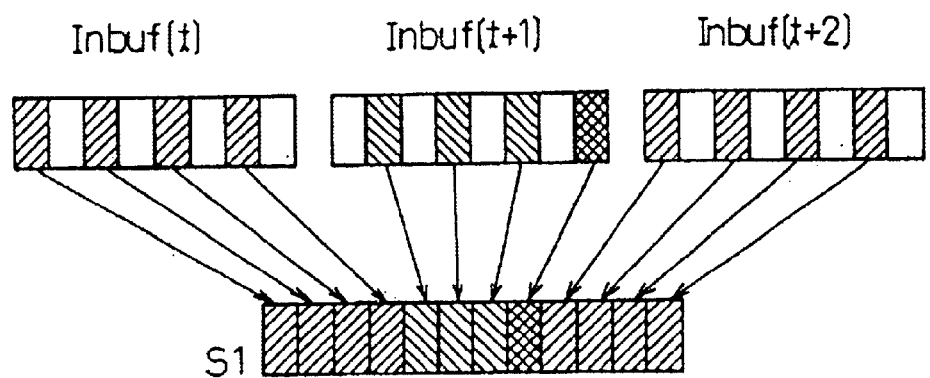
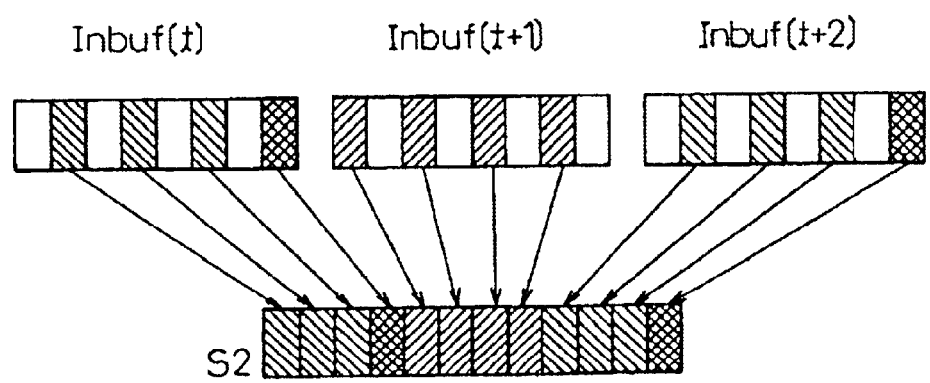

Fig.14
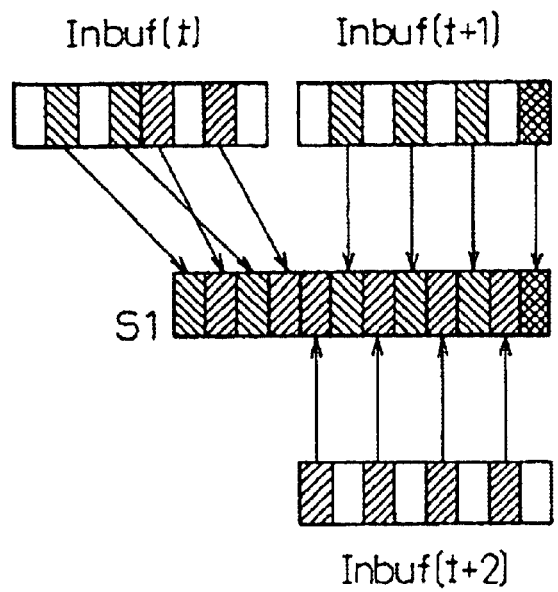
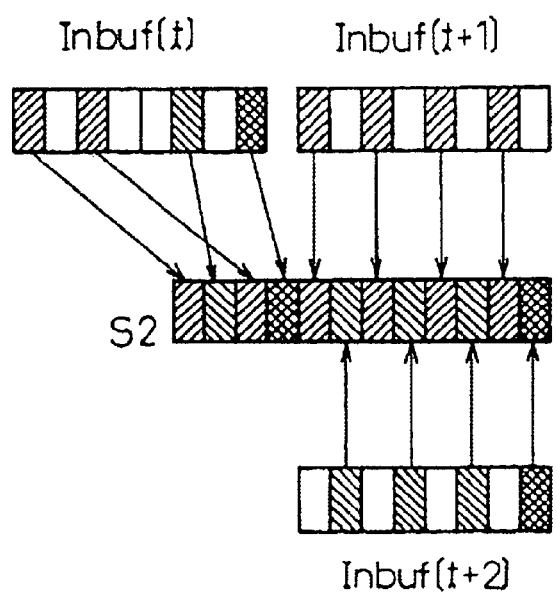

Fig.15
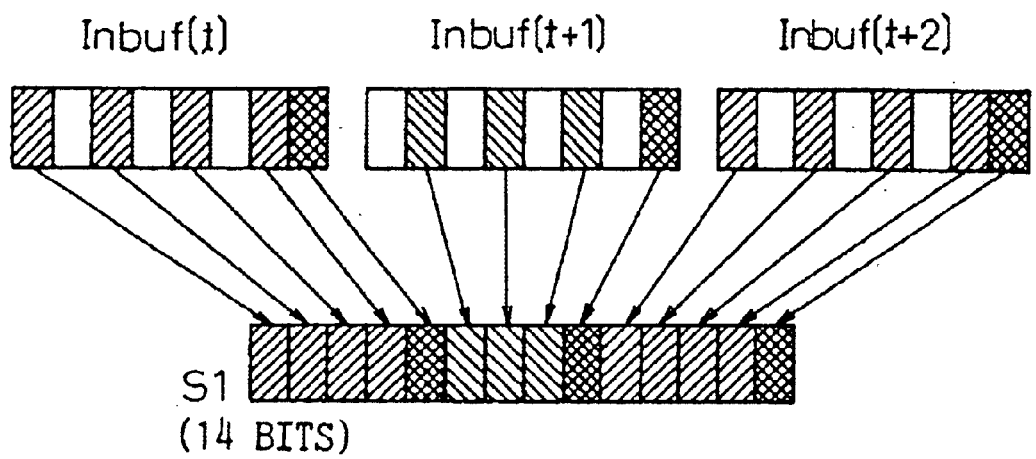
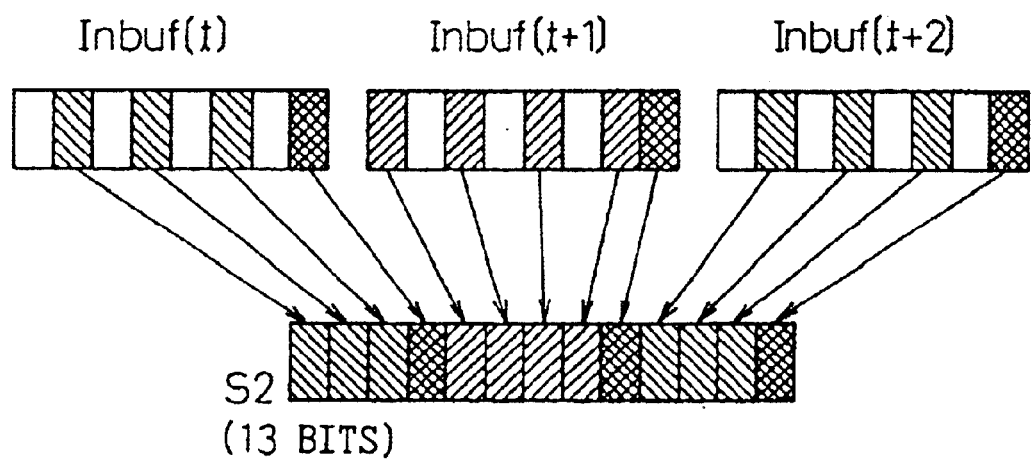

Fig.16
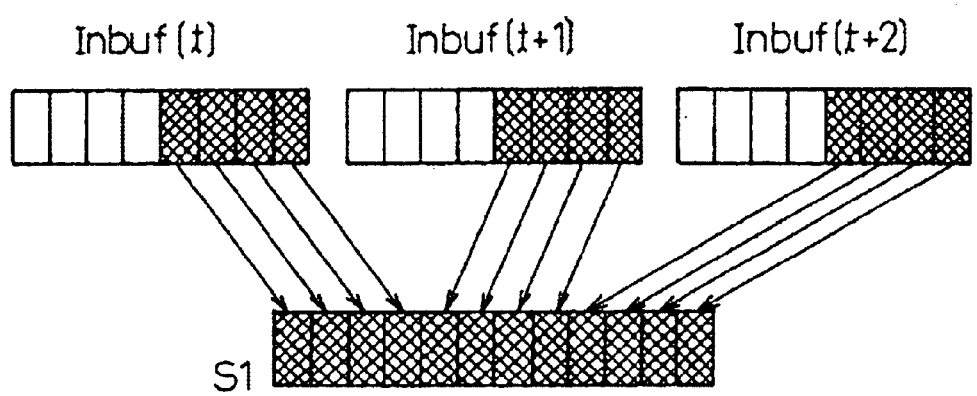
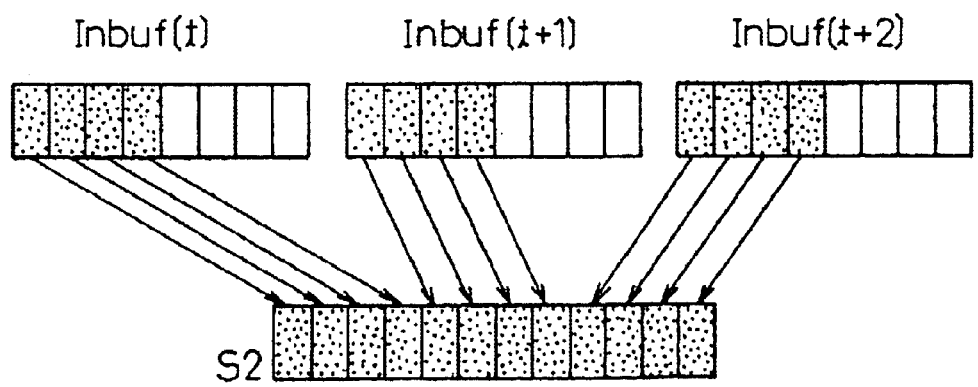

METHOD AND APPARATUS FOR COMPRESSING DATA STRING

This is a Division of application Ser. No. 09/348,163, filed Jul. 7, 1999, now U.S. Pat. No. 6,563,956.

BACKGROUND OF THE INVENTION

1. Field of the Invention

The present invention generally relates to a data compression method and a data compression apparatus, which are used for compressing data by omitting redundant parts contained in various kinds of data, such as character codes and image data-and, more particularly, to a data compression method and a data compression apparatus which employ a dictionary coding scheme utilizing similarity of data sequences.

2. Description of the Related Art

Various kinds of data, such as character codes and image data, are being handled by information processors, such as computers. Consequently, the quantity of data handled by information processors is increasing. Such a large quantity of data usually contains redundant data strings. Storage capacity for storing data can be reduced in an information processor by performing compression processing for omitting such redundant parts. Further, data transmission capacity can be reduced in the information processor by using compressed data. Thus, a data transmission time can be shortened.

The LZ77 compression method and the LZ78 compression method have been known as typical data compression methods using the dictionary coding scheme. The LZ77 compression method can obtain a sufficient compression ratio by performing a simpler process, as compared with the LZ78 compression method. Consequently, the LZ77 compression method is mainly employed for practical use. Therefore, the LZ77 compression method is described hereinbelow.

Incidentally, the present invention can be applied not only to compression of character codes but to that of various kinds of data. However, hereunder, each of data represented in word units will be referred to as a "character" (of an alphabet), and data of an arbitrary number of consecutive words will be referred to as a "character string or sequence", based on information theory.

According to the LZ77 compression method, as illustrated in FIG. 1, a sliding or search buffer 1 of predetermined capacity (incidentally, 16 characters in this example illustrated in this figure) is provided. A character string "defabqaaaacabcde" 2a having already been coded and compressed is stored in this buffer. Subsequently, an encoder searches the sliding buffer for a character string "abcd" 2c which is the maximum or longest match between the stored character string 2a and an input character string 2b "abcdaaaq . . . " to be encoded. The relative address of the position of the character string 2c found as the longest match is 5 (incidentally, this indicates that the character string 2c starts 5 characters back from the start of the input character string 2b). Further, the match length, namely, the length of the found character string is 4. Then, the relative address and the match length are encoded. Moreover, in the input character string 2b, the character string "abcd" 2c, which is the last longest match, is replaced with a codeword or token (5,4) and thus compressed.

Subsequently, the sliding buffer 1 is shifted four characters to the right. The character string 2a set in the sliding buffer is now "bqaaaacabcdeabcd". Then, the encoder searches the next input character string "aaaq . . . " 2b for a match, similarly as in the aforementioned case. Consequently, the current character string "aaa" 2c is found as the longest match. Thus, the occurrence or match position of this character sequence "aaa" in the buffer 1 is 13 (incidentally, this indicates that the current character string "aaa" 2c starts 13 characters back from the first character "a" of the character sequence "aaa" in the input character string 2b). Further, the match length of this longest match "aaa" is 3. Then, such an occurrence position and the match length of this character string "aaa" is encoded in the form of a codeword (13, 3). Moreover, this character string "aaa" is replaced with this codeword (13, 3).

According to LZ77 compression method, as the coding of the input character string proceeds, the encoder shifts the sliding buffer in this way. Therefore, LZ77 compression method is also referred to as a sliding dictionary method.

If the capacity of the sliding buffer used in such an LZ77 compression method is increased, the length of a character string found as the longest match increases. Consequently, the compression ratio is enhanced. However, as a result of the increase in the capacity of the sliding buffer, the encoder should search for an enormous number of combinations of character strings. Thus, in the case of sequentially searching the sliding buffer, the search requires a great deal of effort and time. Therefore, the LZ77 compression method is performed by actually adopting the following process. Namely, a character string (namely, a prefix) consisting of first two to four characters of an input character string and the occurrence position of the prefix are entered into a table as occasion demands, and then the prefix of the input character string is collated with the character list entered into the table, instead of collating all kinds of character strings of the sliding buffer with the input character string. The time required for such search is significantly reduced by employing this process.

The tables used for such a search are a look-up table and a hash table. A method of using a look-up table is to make a character string 2d to be searched for have a one-to-one correspondence to an address in a look-up table 3, as illustrated in FIG. 2. The past occurrence position (namely, the relative address) of the character string is stored at a corresponding address in the look-up table 3. Thus, according to this method, the past occurrence position of the character string "ab" 2d is known by looking up the character string "ab" 2d in the table 3 once to search for this string. Therefore, this method has an advantage in that the search is achieved at a very high speed.

However, in the case that the character string to be searched for is long, the number of combinations of character strings is raised to a higher power. Thus, the look-up table should have an enormous number of addresses. Therefore, this method has a drawback in that a very large amount of memory is needed so as to allocate such an enormous addresses to the look-up table. For example, in the case that the number of characters is 1 (incidentally, 1 character consists of 8 bits), $2^{8*1}$ (=256 bits) of memory are needed. Further, in the case that the number of characters is 2, $2^{8*2}$ ($\approx$64 kbits) of memory are needed. Moreover, in the case that the number of characters is 3, $2^{8*3}$ ($\approx$16 Mbits) of memory are needed. Therefore, the actual limit to the number of characters is 2. Additionally, this method has another drawback in that, when a character string to be searched for is long, only a small part of the look-up table is actually used (namely, only a small part of memory area assigned to the look-up table is used for entering the past occurrence positions of the character string into this table) and that thus, the look-up table is in a sparse state, and the efficiency of use of the look-up table is low.

In the case of a method of searching for a character string by using a hash table, as illustrated in FIG. 3, masking processing is performed on a codeword, which corresponds to a character string to be searched for, in such a way as to decrease the number of bits of the codeword (namely, the degeneration of the codeword is performed). Thus, a hash code 6 is generated (see 4) so that a plurality of character strings having a common degenerated state share an area of the hash table 5. Thus, this method features that, as compared with the method of searching for a character string using a look-up table, a longer character string can be searched for, when a search area, in which the character string is searched for, is equivalent to that used in the method using the look-up table.

However, in the case of the method using the hash table obtained in this way, the degeneration is performed on character strings to be searched for. Thus, there occurs a problem (what is called a collision or conflict problem) that a character string "abc" 2d and another character string, which have a common degenerated state, may be entered into the same area 7 provided in the hash table.

To solve this collision problem, this method further requires an additional operation of collating a character string found by the search with each of characters of a character string to be searched for and checking whether or not the searched or found character string is the character string to be actually searched for.

As described above, in case of the aforementioned method of searching for a character string by using the look-up table according to the LZ77 compression scheme, while a character string to be searched for can be found at a high speed by looking up the character string to be searched for, in the look-up table only once, the table size of the look-up table is increased or raised to a higher power with an increase in the number of characters of the character string to be searched for. Thus, the look-up table has an enormous table size, and the number of characters to be used for the search cannot be large (actually, the limit to the number of characters is 2). Consequently, this method using the look-up table has a drawback in that the compression ratio cannot have a very high value.

On the other hand, in the case of the aforementioned method of searching for a character string by using a hash table, the table size of a necessary table is smaller, as compared with the method of searching for a character string by using the look-up table. Thus, although the search is achieved at a high speed by using the table of a reasonable table size, this method using the hash table has a drawback in that an additional collating operation for solving the collision problem is needed still more. Incidentally, this collating operation should be performed on each of characters of the character string to be searched for and requires a great deal of effort.

SUMMARY OF THE INVENTION

The present invention aims at solving such drawbacks of the prior art. Accordingly, an object of the present invention is to provide a data compression method, and a data compression apparatus, which can search for a character string by using a table, whose table size is substantially equal to a table size of the method of searching for a character string by using a hash table, even when the character string is a long character string consisting of three or four characters, without performing a collating operation on a character string to be searched for, so as to prevent an occurrence of a collision problem.

To achieve the foregoing object, according to a first aspect of the present invention, there is provided a data compression method for generating compressed data by performing a compression process on an uncompressed data string, which comprises the steps of setting a plurality of consecutive characters, which are contained in the uncompressed data string, as a character string to be searched, allocating bits of a bit string representing the aforesaid character string to at least two codewords to thereby generate first and second searching codewords, obtaining first and second array contents from first and second array tables, in which information on past occurrence positions of character strings is previously stored, by using the aforesaid first and second searching codewords as array addresses, collating the obtained first and second array contents with each other, and obtaining past occurrence position information corresponding to the aforesaid character string according to the aforesaid first and second array contents when the first and second array contents match with each other.

According to a second aspect of the present invention, there is provided a data compression method for generating compressed data by performing a compression process on an uncompressed data string, which comprises the steps of setting a plurality of consecutive characters, which are contained in the uncompressed data string, as a character string to be searched, allocating bits of a bit string representing the aforesaid character string to two codewords to thereby generate a first searching codeword and a second searching codeword that is a complementary codeword to the aforesaid first searching codeword, obtaining an array content from a first array table, in which the aforesaid second codeword relating to past occurred character strings is previously stored, by using the aforesaid first searching codeword relating to the set character string to be searched at present as an array address, collating the obtained array content with the aforesaid second codeword, and obtaining information on past occurrence positions of the aforesaid set character string from a second array table, in which past occurrence positions of character strings are previously entered, by using the aforesaid first codeword as an array address when the array content matches with the aforesaid second codeword.

According to a third aspect of the present invention, there is provided a data compression method for generating compressed data by performing a compression process on an uncompressed data string, which comprises the steps of setting a plurality of consecutive characters, which are contained in the uncompressed data string, as a character string to be searched, allocating bits of a bit string representing the aforesaid character string to two codewords to thereby generate a first searching codeword and a second searching codeword that is a complementary codeword to the aforesaid first searching codeword, obtaining a plurality of codewords, whose starting point is the aforesaid first codeword, by performing an operation on the aforesaid first codeword, obtaining a plurality of array contents from a first array table, in which the aforesaid second codeword relating to past occurred character strings is previously stored, by using the aforesaid obtained plurality of codewords relating to the set character string to be searched at present as array addresses, collating the obtained plurality of array contents with the aforesaid second codeword, and obtaining information on past occurrence positions of the aforesaid set character string from a second array table, in which past occurrence positions of character strings are previously entered, by using the aforesaid codewords obtained by aforesaid operation as an array address when the array content matches with the aforesaid second codeword.

In the case of the data compression method according to each of the aforementioned aspects of the present invention, the bits of a bit string representing the character string to be searched are allocated to at least two codewords, and the table is looked up correspondingly to each of the codewords. Further, results of the look-up of the tables are collated with each other. Thus, it is checked whether or not the character string occurred in the past and whether or not information on the past occurrence position is entered in the table. Therefore, as compared with the case that the bit string representing the character string itself is used as the addresses (namely, the case of using the look-up table), the size of the table, which is necessary for looking up the table, is significantly reduced by allocating the character string to at least two codewords and constituting addresses.

Hence, even when a relatively long character string (for instance, a character string having 3 or 4 characters) is set, necessary memory does not increase very much, as compared with the conventional methods. Moreover, only an operation of checking the contents of the arrays is employed as the operation of checking the match after the look-up of the character string to be searched for. Thus, the amount of work is considerably reduced, as compared with the method using a hash table, which requires checking a match corresponding to each of the characters of the character string to be searched for.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 9 is a functional block diagram illustrating the basic principles of a second embodiment according to the data compression method of the present invention;

FIG. 13 is a conceptual diagram illustrating a process for generating a searching (or detecting) code in the data compression method of the present invention;

FIG. 14 is a conceptual diagram illustrating another searching (or detecting) code in the data compression method of the present invention;

FIG. 15 is a conceptual diagram illustrating still another searching (or detecting) code in the data compression method of the present invention; and FIG. 16 is a conceptual diagram illustrating yet another searching (or detecting) code in the data compression method of the present invention.

DETAILED DESCRIPTION OF THE PREFERRED EMBODIMENTS

Hereinafter, data compression methods and apparatuses of the present invention will be described in detail by referring to the accompanying drawings.

Figure 4:
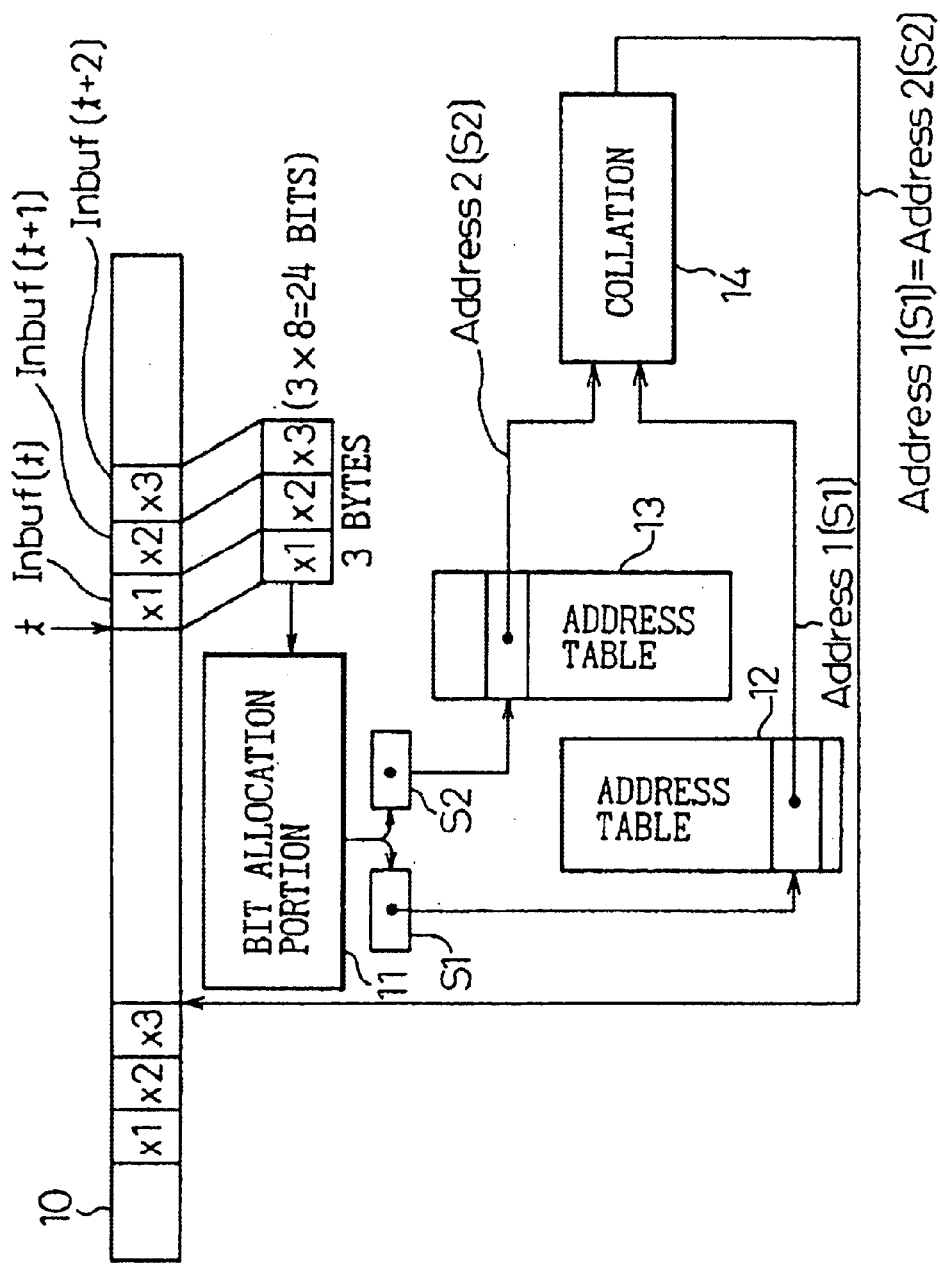
FIG. 4 is a functional block diagram illustrating the basic principles of a first embodiment according to a data compression method of the present invention.

FIG. 4 is a block diagram illustrating a data compression method and an apparatus therefor, according to the first embodiment of the present invention. In the case of this embodiment, an input buffer 10 is used, instead of a sliding buffer. Then, a pointer is successively moved with respect to a character string inputted to the input buffer 10. Search is performed on a character string starting at the position indicated by the pointer. The constitution of this embodiment will be described hereinbelow by taking as an example the case that the pointer is now placed at the position t and that it is checked whether or not a string consisting of three characters x1, x2 and x3 respectively placed at the positions (Inbuf[t]), (Inbuf[t+1]) and (Inbuf[t+2]) subsequent to the position t is present in the past.

First, the obtained three characters x1, x2 and x3 are inputted to a bit allocating portion 11. Then, all bits (24 bits in the case that 1 character consists of 8 bits) of this character string are divided into two groups of 12 bits. Further, these two groups are allocated to first and second bit codewords S1 and S2, respectively. In this embodiment, preferably, the allocation of the bits is performed so that the bits indicating the features of the original character string are distributed to the codewords S1 and S2 as evenly as possible. The method of allocating the bits will be described later.

Reference numerals 12 and 13 designate first and second address tables, respectively. The first and second bit codewords S1 and S2 generated by the bit allocating portion 11 are used as addresses for arrays. Thus, the occurrence positions of the leading parts of the character strings occurred in the past, namely, the addresses in the input buffer 10 are previously entered in the first and second address tables. Therefore, if the tables are now looked up by using the first and second bit codewords S1 and S2, which are generated correspondingly to the character string consisting of 3 characters and starting at the position t, as the addresses for arrays, Address1[S1] and Address2 [S2] respectively obtained from the tables 12 and 13 match with each other in the case that the character string occurred in the past.

A collation (or match detecting) portion 14 is a unit for checking the match between Address1[S1] and Address2[S2]. If there is no match therebetween (Address1[S1] ≠Address2[S2]), this indicates that the character string did not occur in the past (namely, is not entered in the tables). If matches (Address1[S1]=Address2[S2]), Address1[S1] or Address2[S2] indicates the past occurrence position of the character string X1X2X3 in the input buffer 10.

Figure 1:
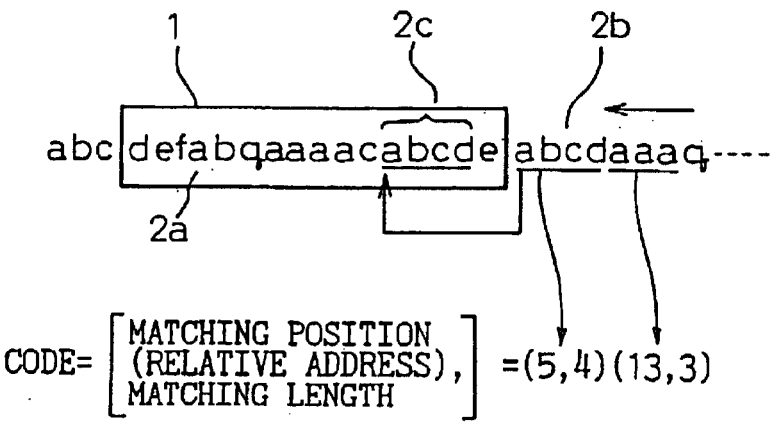
FIG. 1 is a conceptual diagram illustrating a basic operation according to a conventional data compression method using a dictionary coding scheme.
Figure 2:
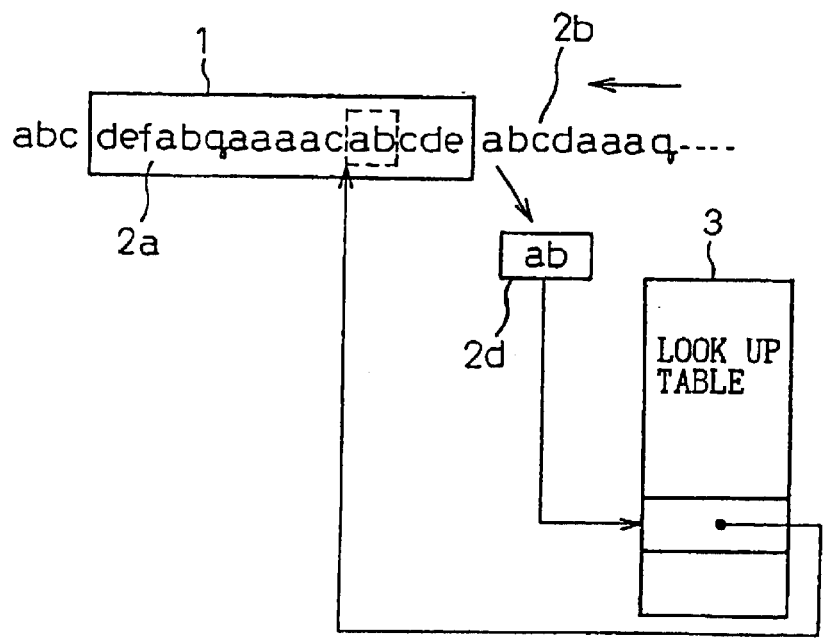
FIG. 2 is a conceptual diagram illustrating a basic operation to be performed in a process of searching for a character string by using a look-up table, according to the data compression method shown in FIG. 1.
Figure 3:
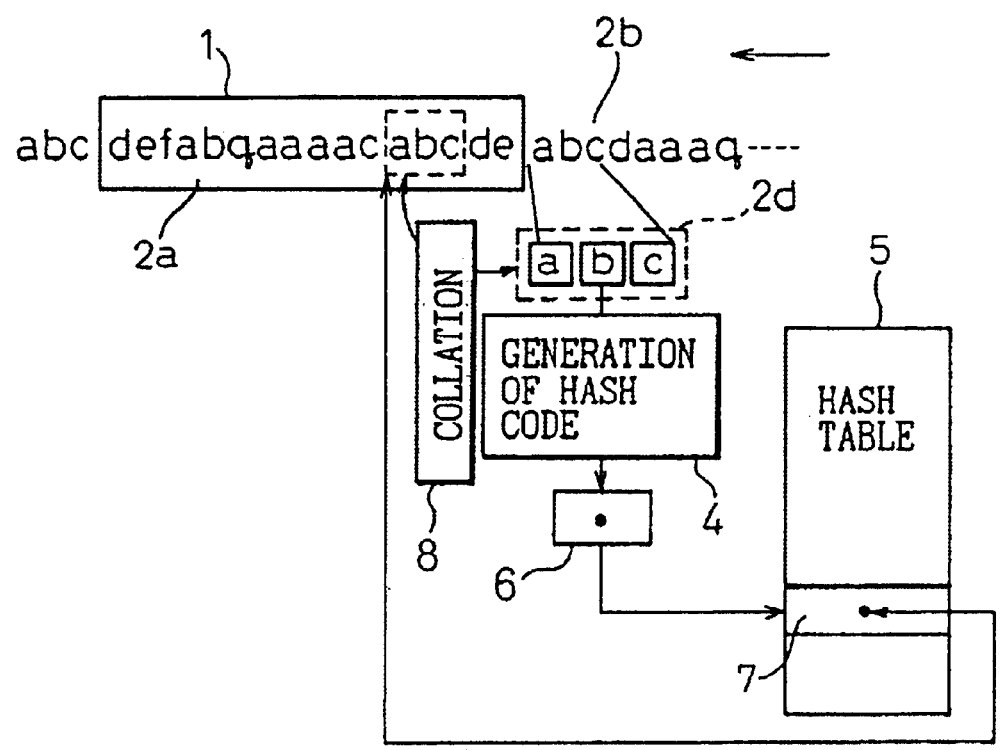
FIG. 3 is a conceptual diagram illustrating a basic operation to be performed in a process of searching for a character string by using a hash table, according to the data compression method shown in FIG. 1.

In the case of this embodiment, as described above, the character string is divided into first and second bit codewords, each of which consists of 12 bits, and an address table is generated correspondingly to each of the first and second bit codewords. Thus, the size of each of the address tables is $2^{12}$. Therefore, two address tables require only a $2 \times 2^{12}$ (=$2^{13}$) memory area. Consequently, the necessary memory area is significantly reduced, in comparison with the conventional methods. Incidentally, the necessary memory area needed by the case of the conventional method illustrated in FIG. 1 is $2^{24}$.

Figure 11:
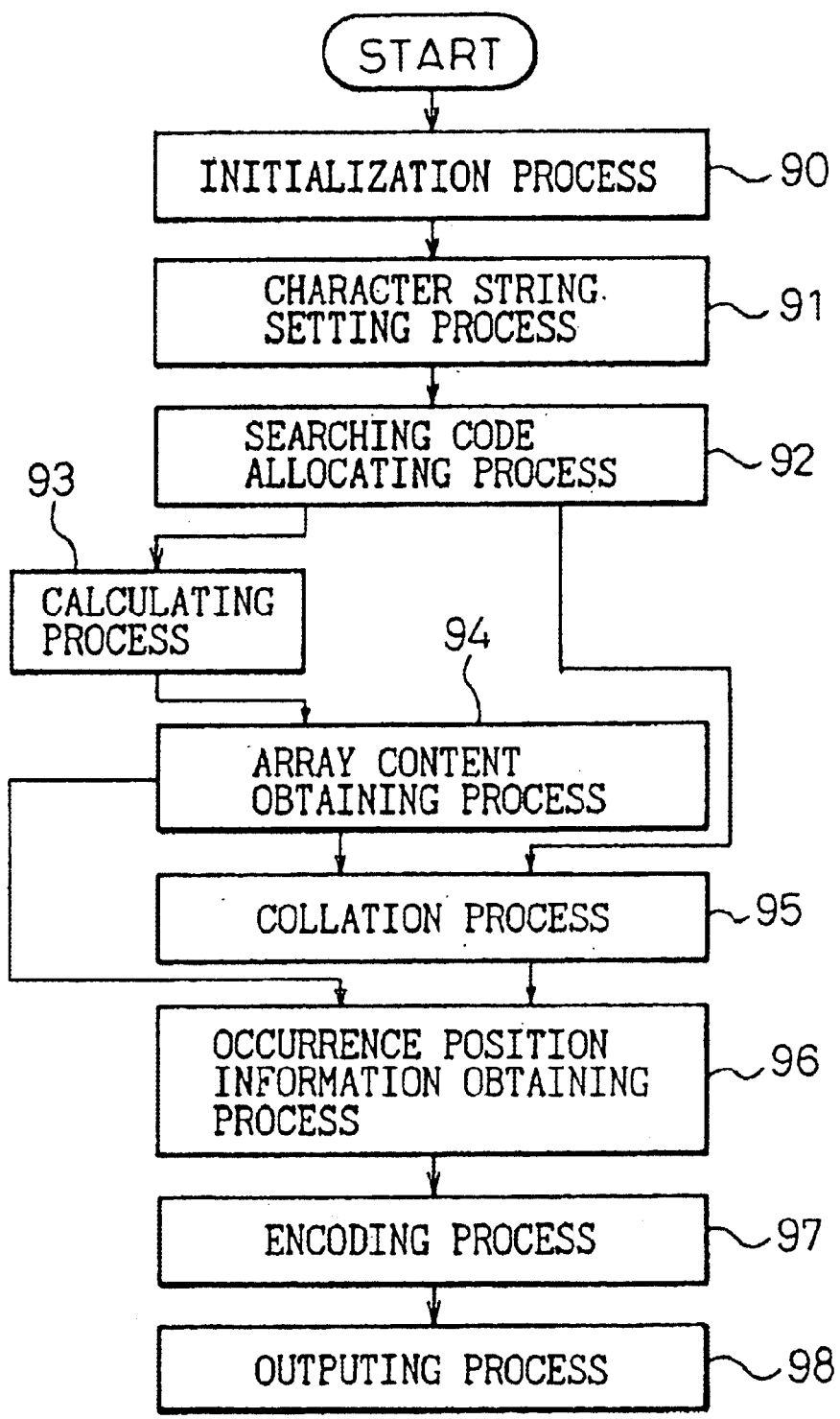
FIG. 11 is a block diagram illustrating a step for performing the data compression method according to the second embodiment of the present invention.

Further, the addresses of the tables respectively corresponding to the bit codewords S1 and S2 have a one-to-one correspondence with each other. Thus, corresponding to each of the bit codewords S1 and S2, a result of the search can be determined by only once looking up the table. Therefore, a high searching speed, which is nearly equal to that of the conventional method illustrated in FIG. 11, is obtained.

Figure 5:
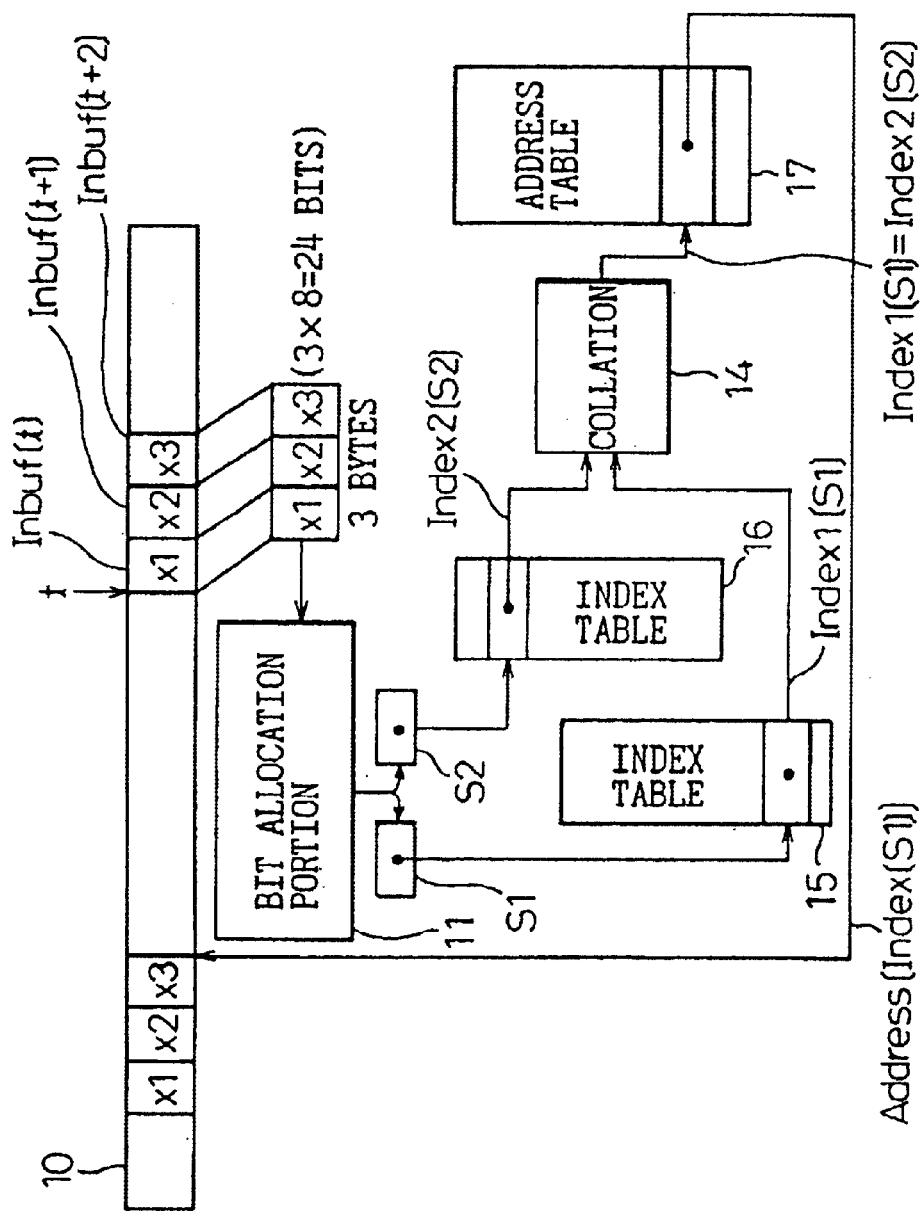
FIG. 5 is a functional block diagram illustrating a modification of the first embodiment shown in FIG. 4.

In the case of the embodiment shown in FIG. 4, the addresses held in the input buffer 10 are directly entered into the address tables 12 and 13 as the contents thereof. Then, the relative addresses are outputted as one field or part of the codeword. However, as illustrated in FIG. 5, first and second index tables 15 and 16, in each of which an index value is entered as the contents of a corresponding one of the bit codewords S1 and S2 indicating an address in the corresponding array, may be utilized. In this case, a match between the contents Index1[S1] and Index2[S2] respectively obtained from the tables 15 and 16 is checked by the collation (or match detecting) portion 14. If the match (Index1[S1]=Index2[S2]) is detected, the address of the past occurrence of the character string is obtained from the address table 17. In the case that Index1[S1]≠Index2[S2] (namely, in the case of the collision), this indicates that this character string to be searched for is not entered in the table. According to this method, the memory is more efficiently used.

Further, the allocation of the bits of the character string to the bit codes is not always the decomposition of the character string only to two kinds of codewords, though the details will be described later. As long as the bit codewords are of two or more kinds, such bit codes may be adopted. Moreover, it is not always necessary to divide the character string into groups of bits of the same number. Furthermore, each of the bit codes S1 and S2, to which the bits of the (original) character string are allocated, may contain the same bit (for example, the least significant bit) of the original character string.

Figure 6:
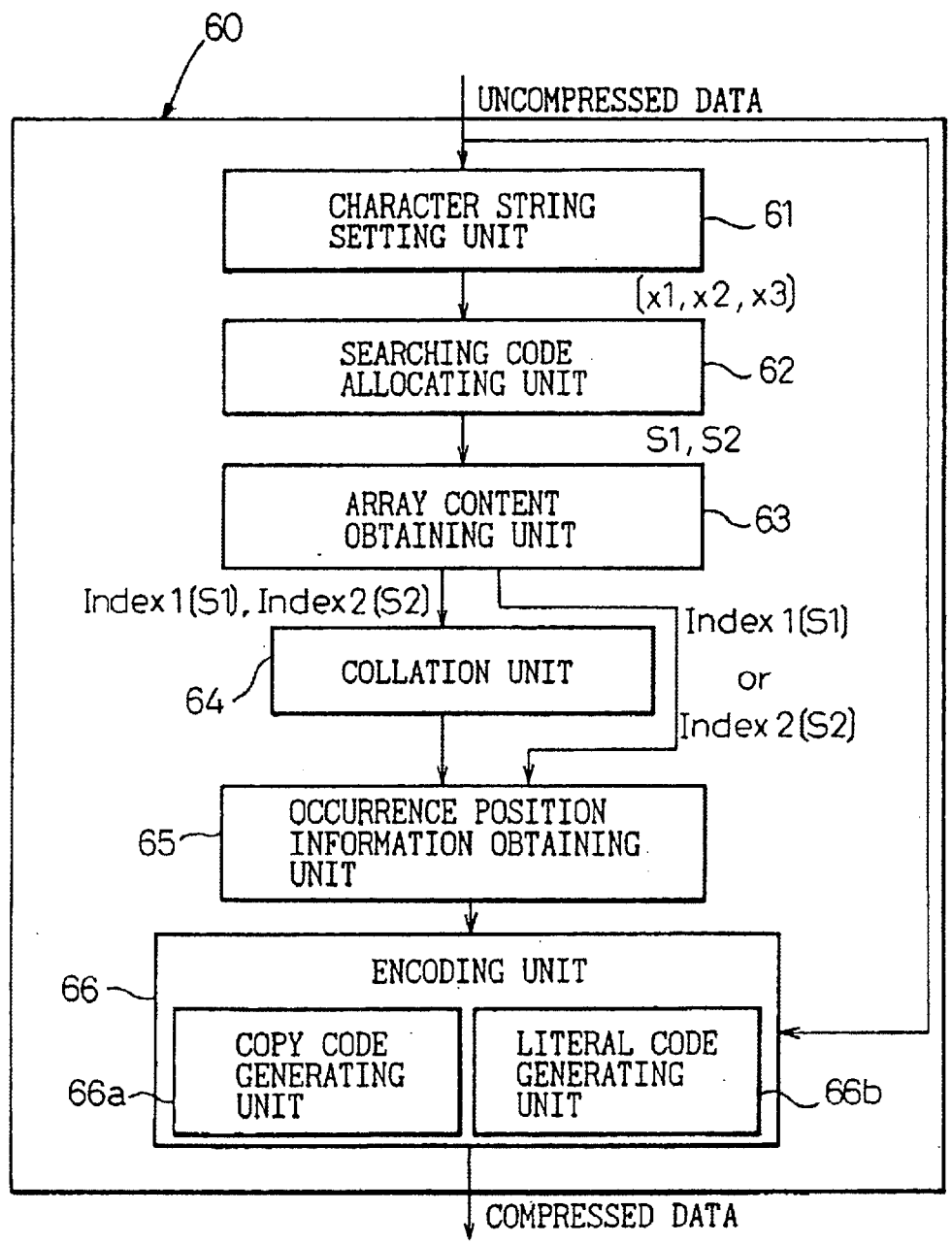
FIG. 6 is a block diagram illustrating the constitution of an apparatus for performing a data compression method according to the first embodiment of the present invention.

FIG. 6 is a block diagram of an apparatus for performing the compression method according to the aforementioned embodiment. As shown in this figure, hardware of this data compression apparatus 60 mainly comprises a character string setting unit 61, a searching code allocating unit 62, an array content obtaining unit 63, a collation unit 64, an occurrence position information obtaining unit 65, and an encoding unit 66 having a copy code generating portion 66a and a literal code generating portion 66b.

The character string setting unit 61, the searching code allocating unit 62, the array content obtaining unit 63, the collation unit 64, the occurrence position information obtaining unit 65 and the encoding unit 66 are constituted mainly by a microprocessor adapted to execute a program code describing the data compression method illustrated in FIG. 4 or 5.

The character string setting unit 61 has a function of setting consecutive plural characters Inbuf[t], Inbuf[t+1], Inbuf[t+2], which are included in an uncompressed data string stored in the buffer Inbuf as an object to be compressed, as a character string to be searched for, and is operative to perform mainly a step of receiving characters and passing the characters to the searching code allocating unit 62 (to be described later). In the case of this embodiment, three characters Inbuf[t], Inbuf[t+1], Inbuf[t+2], each of which consists of 8 bits and is included in the uncompressed data string stored in the buffer Inbuf, are set as a character string which is to be searched for and consists of 24 bits.

The searching code allocating unit 62 has a function of allocating the bits of a bit string representing a search character string, which is determined by the character string setting unit 61 and consists of 24 bits, to a plurality of searching codes, and is operative to perform mainly a searching code allocating step.

In the case of this embodiment, the bits of a bit string representing a character string, which consists of 24 bits and is obtained by the character string setting unit 61, are allocated to the two searching codewords S1 and S2.

In the case that the searching codewords S1 and the searching S2 for the character string, which consists of 24 bits and to be searched for, are determined, it is possible to set the number of bits of the searching code S1 at, for example, 20 and to set the number of bits of the searching codeword S2 at, for instance, 4. Alternatively, both of the numbers of bits of the searching codewords may be set at 12. Furthermore, a plurality of searching codewords may share a part of the bits of the bit string representing the character string to be searched for. This embodiment sets the number of bits of the searching codeword S1 at 12, and the number of bits of the detecting codeword S2 at 12.

The array content obtaining unit 63 is operative to set a searching code, which is determined by the searching code allocating unit 62, as an array address, and then obtain the array contents from the index table or the address table. The collation unit 64 is operative to perform a process of collating or checking whether or not the array contents match with each other.

The occurrence position information obtaining unit 65 has a function of obtaining the past occurrence position information corresponding to the character string to be searched for, according to the matched array content or data based on the matched array content when the collated array contents match with each other.

The encoding unit 66 has a copy code generating portion 66a adapted to output a copy code when obtaining the past occurrence position information corresponding to the character string to be searched for, and also has a literal code generating unit 66b adapted to output a literal code when it does not obtain the past occurrence position information corresponding to the character string to be searched for. The encoding unit 66 is operative to perform mainly a copy code generating step and a literal code generating step (to be described later).

The copy code generating portion 66a is operative to perform the following operations. Namely, the portion 66a is operative to perform a match length calculating operation of obtaining as match length information FL information on the length of a consecutive character string found as a match between the content of an array, which corresponds to addresses from a past occurrence address determined as a starting point, and input data. Further, the portion 66a is operative to perform an operation of outputting information on an address (Address[Index[S1]]) held in the input buffer or information on a relative address (Address [Index[S1]]–t) with respect to a current input position as past occurrence address information. Moreover, the portion 66a is operative to output a registration number (Index1[S1]) entered in the table in the past or a relative number (Counter-Index1[S1]) with respect to a current registration number as past occurrence address information. Furthermore, the portion 66a is operative to perform an encoding output operation of encoding the past occurrence address information and the match length information FL and outputting a resultant code.

The literal code generating portion 66b is adapted to perform a encoding output operation of outputting an uncompressed data string stored in the buffer Inbuf without change or outputting data based on the uncompressed data string (for example, data obtained by encoding the uncompressed data string).

Figure 7:
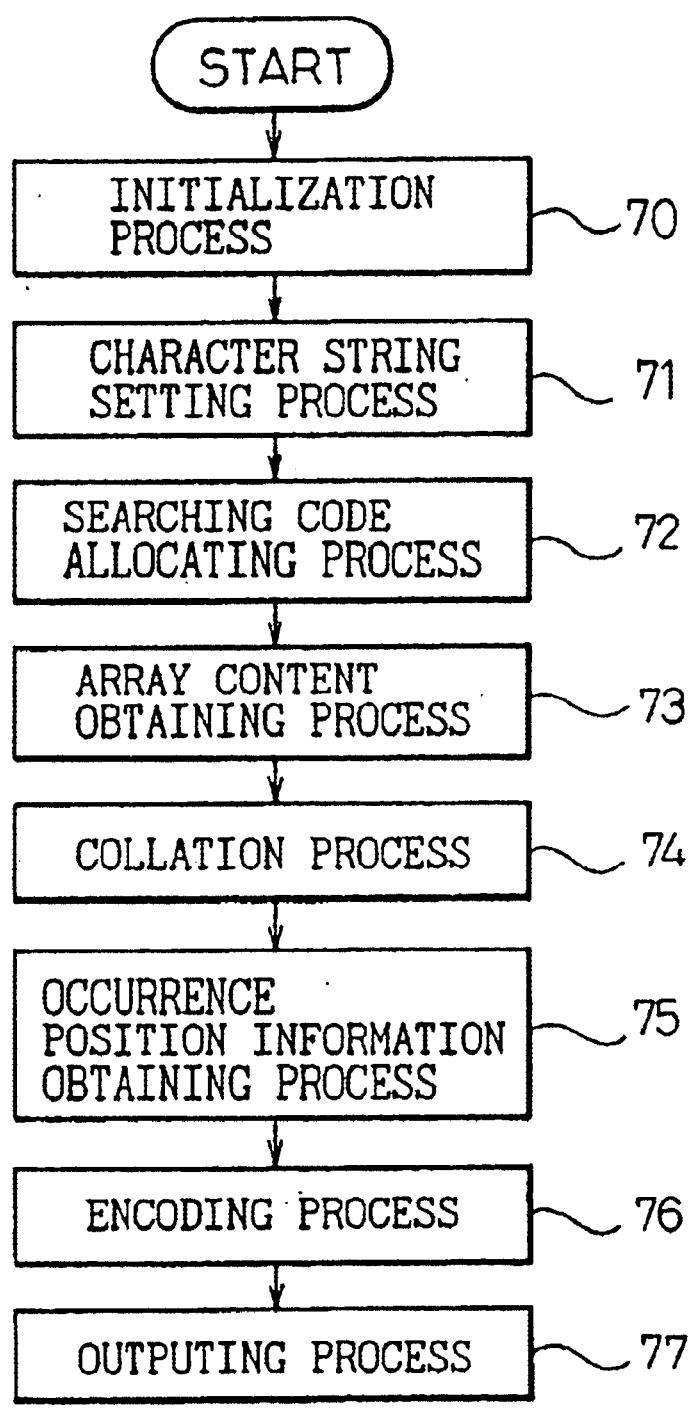
FIG. 7 is a block diagram illustrating a step for performing the data compression method according to the first embodiment of the present invention.
Figure 8A:
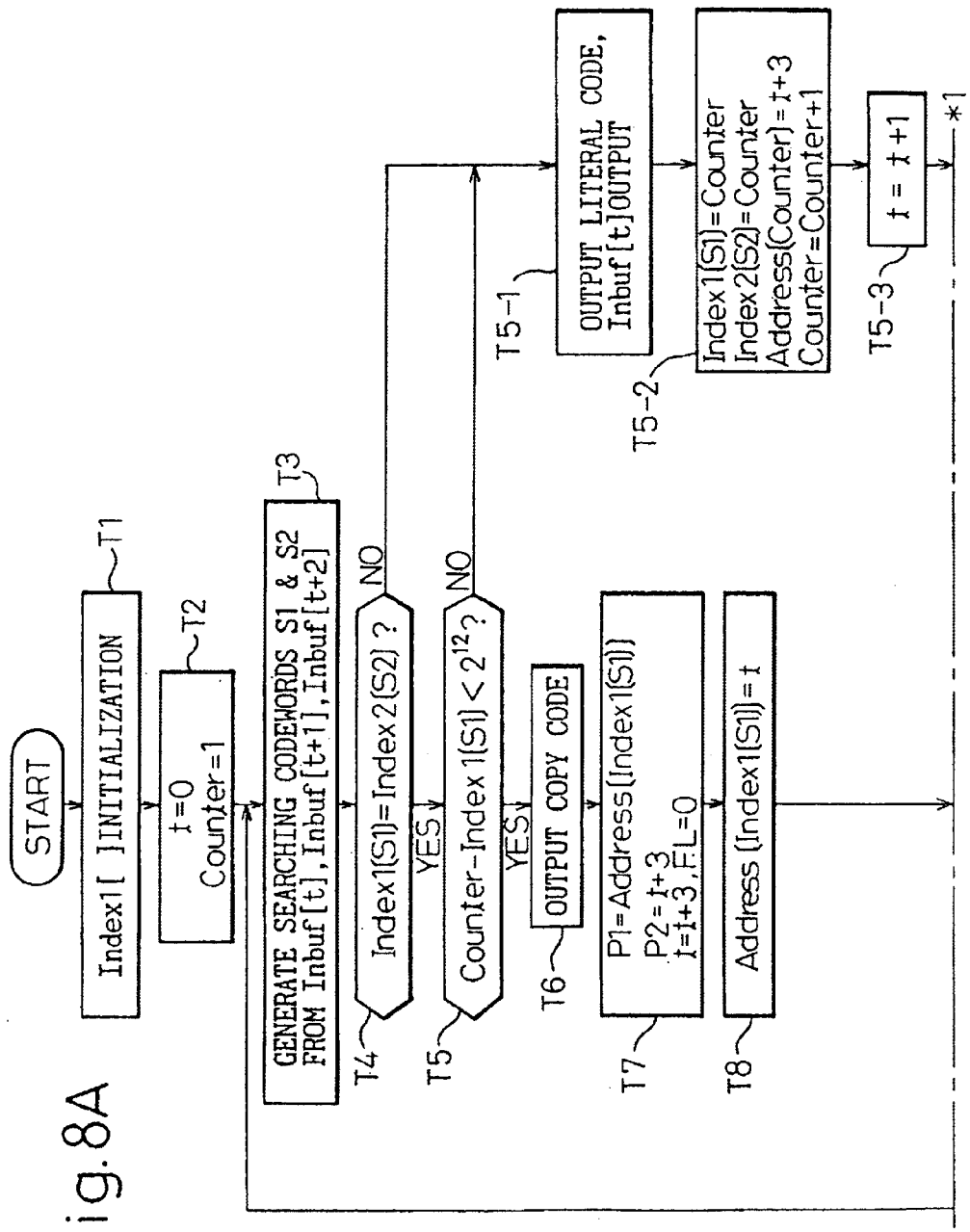
FIGS. 8A and 8B are a flowchart illustrating the case of implementing the first embodiment of the present invention by programming.
Figure 8B:
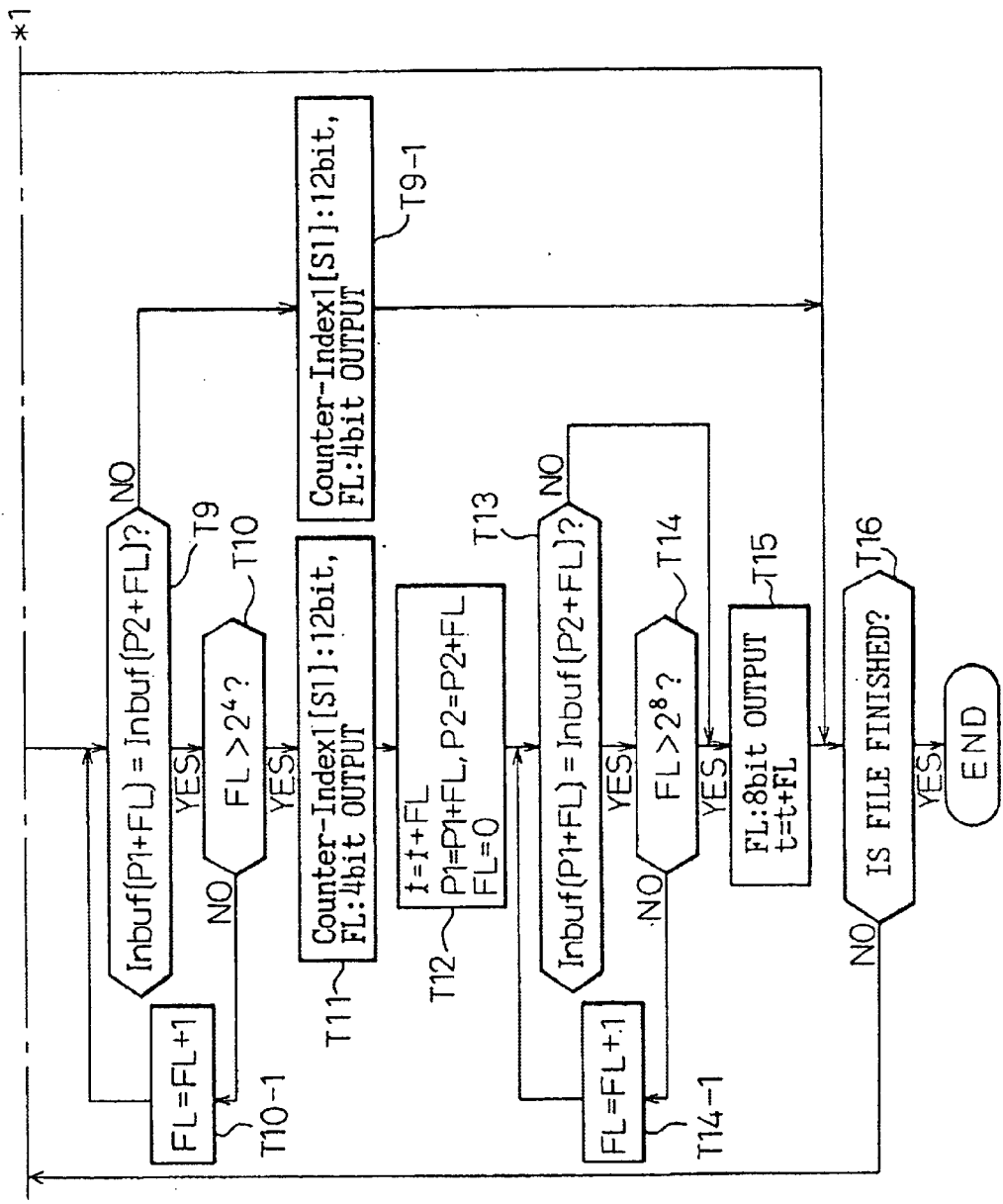

FIG. 7 is a flowchart illustrating a basic step of the data compression method which is the first embodiment of the present invention. FIGS. 8A and 8B show a basic flowchart for programming.

Incidentally, in the following description, the embodiment will be described. However, the present invention is not limited to compression techniques, such as dictionary coding schemes, but applied to an ordinary search for a character string.

The data compression method of the first embodiment has logical constitution which comprises an initialization process 70, a character string setting process 71, a searching code allocating process 72, an array content obtaining process 73, a collating process 74, an occurrence position information obtaining process 75, an encoding process 76 and a compressed data outputting process 77, as illustrated in FIG. 7. Further, this method is described by a program code which can be executed by the aforementioned microprocessor.

The initialization process 70 corresponds to, for example, steps T1 and T2 in FIGS. 8A and 8B. Namely, Index1 is initialized. Further, a value t, which indicates a current compressing position is set at 0, and a counter for registering the number of character strings is set at 1. Then, in the character setting process 71, a plurality of consecutive characters Inbuf[t], Inbuf[t+1] and Inbuf[t+2] are set as a character string (8 bits×3=24 bits) to be searched for, by employing a current encoding position t on the uncompressed data string, which is stored in the buffer Inbuf, as a starting point.

In the searching code allocating process 72, bits of a bit string representing the searching character string obtained in the preceding process are allocated to a plurality of searching codewords. The searching code allocating unit 62 performs the process 72 by playing a leading role. In this embodiment, bits of a bit string representing the character string consisting of 24 bits to be searched for are allocated to the two searching codewords S1 and S2. Incidentally, this process is described at step T3 in the flowchart of FIG. 8.

In the array content obtaining process 73, the contents Index1[S1] and Index2[S2] or Address1[S1] and Address2[S2] of the array are obtained from the index table or the direct address table by using the searching codewords S1 and S2 established in the preceding process as the addresses of the array. The array content obtaining unit 63 performs the process 73 by playing a leading role.

In the collation process 74, it is checked by collation whether or not the array contents Index1[S1] and Index2[S2] or Address1[S1] and Address2[S2] obtained in the preceding process 73 match with each other. The collation unit 64 performs the process 74 as a leading unit. In the flowchart of FIG. 8, this process is performed mainly at step T4.

In the occurrence position information obtaining process 74, when the array contents index1[S1] and index2[S2] collated in the preceding process match with each other (YES at step T4), or when the array contents index1[S1] and address2[S2] collated in the preceding process match with each other, the past occurrence position information corresponding to the character string to be searched for is obtained according to the array contents. In the case of the example of FIG. 4, the past occurrence position information is index1[S1] or address2[S2] (these array contents match with each other). In the case of the example of FIG. 5, the past occurrence position information is address[Index[S1 or S2]].

In the flowchart of FIG. 8, at step T5, information (Counter-Index1[S1]<$2^{12}$) on the recent occurrence of the obtained array contents index1[S1] and index2[S2] is obtained as a part of occurrence position information (at step T5).

The encoding process 76 has a copy code generating process for generating a copy code when occurrence position information is obtained in the occurrence position information obtaining process 74 (YES at step T5), and also has a literal code generating process for generating a literal code when no occurrence position information is obtained (NO at step T4 or T5). The copy code generating process is performed at steps T6 to T15 in the flowchart of FIGS. 8A and 8B. The literal code generating process is performed at steps T5-1 to T5-2 (or step T5-3).

The copy code generating process is performed mainly by the copy code generating portion 66a of FIG. 6. The literal code generating process is performed mainly by the literal code generating portion 66b. In the outputting process 77, compressed data is outputted from the obtained copy code. Alternatively, a literal code is outputted.

Hereinafter, the additional description of an operation of the apparatus will be given by referring to the flowchart of FIG. 8. For example, in the case of the example of FIG. 5, if the array content Index1[S1] is equal to the array content Index2[S2] (YES at step T4), this reveals that the character string to be searched for, Inbuf[t], Inbuf[t+1] and Inbuf[t+2] occurred in the past. At that time, the address that occurred in the past search for the character string is obtained from the Address table (at step T7) by using the array content Index1[S1] or Index2[S2], which is held in the index table shown in FIG. 5, as the address.

Incidentally, at step T7, P1 and P2 are variables that are tentatively used at steps T7 to T9 (or T12 to T13). A past occurrence position and a current position are substituted for P1 and P2, respectively. At steps T7 to T9, the match length FL of a match (consisting of consecutive characters) between bytes subsequent to the three bytes occurred in the past and a part of input data, which part follows the input data Inbuf[t+3], is checked and obtained. The current position P2 is obtained as (t+3), because it has been checked at steps T3 and T4 whether or not there is a match between the leading 3 characters and the search buffer.

The match length information FL and the relative address information (Count-Index1[S1]) are outputted (at steps T11 and T9-1). If NO at step T5, a code indicating a literal mode (namely, a literal code) and a corresponding Inbuf(t) are outputted from the apparatus (steps T5-1).

In this embodiment, when the match length is not less than ($2^4$−1) (namely, YES at step T10), an additional 8 bits are allocated to the match length code (at step T15). In the case of the literal mode, the match length information of one byte is outputted without change (step T5-1).

On the other hand, in the literal code generating process (at steps T5-1 and T5-2), the uncompressed data string stored in the buffer Inbuf(t) is outputted without change, or data based on the uncompressed data string is encoded and then the resultant code is outputted.

The aforementioned search and encoding process (steps T1 to T16) are repeated until an operation of compressing an input file is finished.

As described above, in the case of the data compression method and the data compression apparatus according to the first embodiment of the present invention, character strings can be searched for and data can be compressed at a searching speed, which is nearly equal to the speed in the case of the method using the look-up table, by using only a small amount of memory for a table, which is substantially equal to the amount of the necessary memory used in the case of the method using the hash table.

Moreover, there is no need for collating each of the characters of the string, differently from the method using the hash table. Thus, the process of looking for a match can be simplified.

Figure 10:
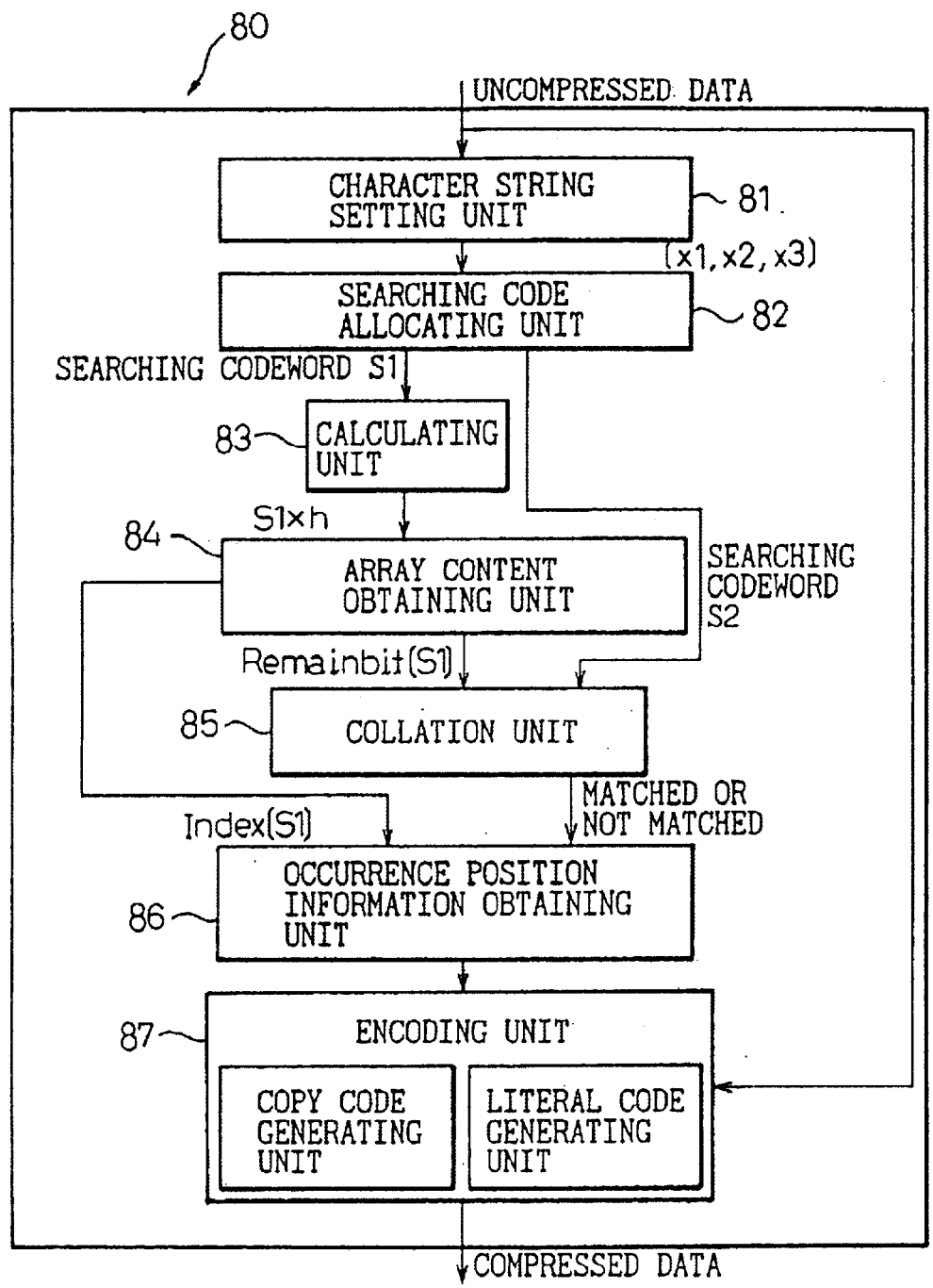
FIG. 10 is a block diagram illustrating the configuration of an apparatus for performing the data compression method according to the second embodiment of the present invention.
Figure 12A:
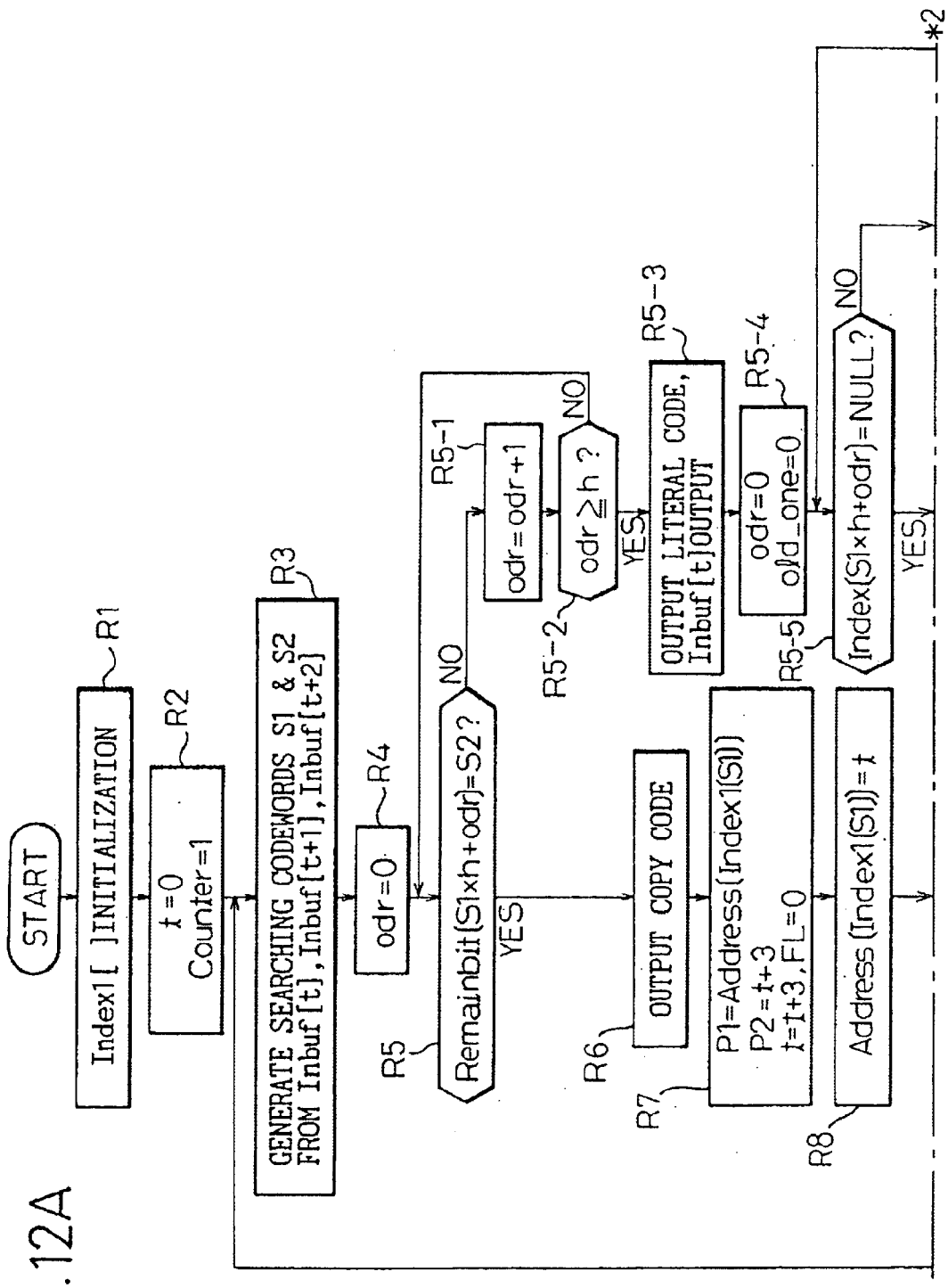
FIGS. 12A and 12B are a basic flowchart illustrating the case of implementing the second embodiment of the present invention by programming.
Figure 12B:
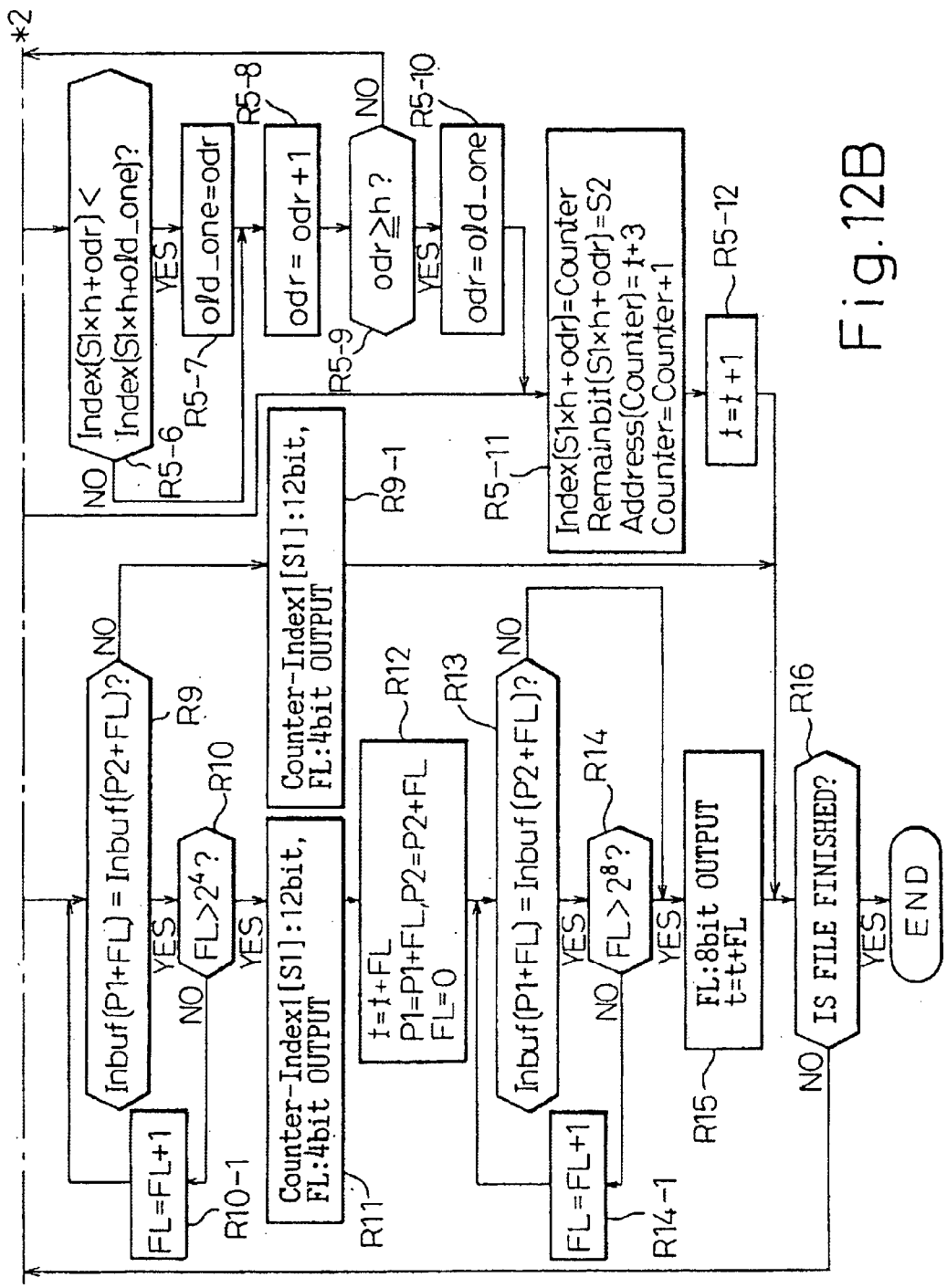

FIG. 9 is a conceptual diagram illustrating the basic principles of a second embodiment according to the data compression method of the present invention. FIG. 10 is a block diagram illustrating the configuration of an apparatus for performing this data compression method. FIG. 11 is a block diagram illustrating a basic step for performing the data compression method according to this embodiment of the present invention. FIGS. 12A and 12B are a basic flowchart illustrating the case of implementing this embodiment of the present invention by programming.

In this embodiment, as illustrated in FIG. 9, first, characters of the input character string Inbuf[t], Inbuf[t+1] and Inbuf[t+2] are allocated to the bit codewords S1 and S2 in the bit code allocating portion 11. The codewords S1 and S2 are adapted so that bits representing the features of the characters are allocated to the codeword S1 as much as possible.

Further, the codewords S1 and S2 are complementary to each other in relation to the bit string before allocated. Namely, the codeword S2 consists of the remaining bits (Remain.bit) obtained by removing the codeword S1 from the original or initial bit string.

In this embodiment, the codewords S1 and S2 each consist of character strings occurred in the past. Further, the codeword S1 is used as the address of the array. Moreover, a table (Remainbit Table) 20, in which the codeword S2 is entered as the content of the array, is prepared.

In the case of performing data compression, the table is looked up by using the codeword S1 constituted by the characters Inbuf[t], Inbuf[t+1] and Inbuf[t+2] of the input character string as the address of the array. Thus, the content of the array are obtained. This content of the array is collated with the codeword S2. If they match each other, it is found that such a character string occurred in the past. Therefore, similarly as in the case of the first embodiment, the past occurrence position of the input character string are obtained by referring to an index table 21 by using the codeword S1 as the address of the array, or by directly referring to the address table 22.

As illustrated in FIG. 9, there is provided a modification of this embodiment, in which a plurality of candidates for a match are obtained in the Remainbit Table 20 by forming a plurality (an arbitrary number h) of addresses as a result of performing a calculation on the codeword S1. In this case, the probability of a match is enhanced by collating the plurality of candidates for a match with the codeword S2. Incidentally, if "h" is regarded as 1, the aforementioned second embodiment is included by this modification. Thus, hereunder, a description will be made by regarding the aforementioned second embodiment as the same as this modification.

The data compression method of the aforementioned second embodiment features that the character string search according to the dictionary coding scheme can be simply achieved at a high speed. As shown in FIG. 11, this method has logical constitution mainly comprising an initialization process 90 (at steps R1, R2 and R3 in the flowchart of FIGS. 12A and 12B), a character string setting process 91 (at step R3), a searching code allocating process 92 (at step R3), a searching code allocating process 92 (at step R3), a calculating process 93, an array content obtaining process 94, a collation process 95 (at step R5), an occurrence position information process 96, an encoding process 97 and an outputting process 98. Further, this method is described by a program code that can be executed by the aforementioned microprocessor.

In the character string setting process 91 (at step R3), a plurality of consecutive characters Inbuf[t], Inbuf[t+1] and Inbuf[t+2] starting from the character search starting point t acting as a starting point in the uncompressed data string 10a are set as the character string to be searched for. This process is performed mainly by the character string setting unit 81 of FIG. 10. In this embodiment, three characters Inbuf[t], Inbuf[t+1] and Inbuf[t+2] are set as the character string to be searched for, similarly as in the case of the data compression method of the aforementioned first embodiment.

In the searching code allocating process, 92 (at step R3), the bits of the bit string representing the character string obtained in the preceding process are allocated to the two searching codewords. One of the codewords is set as a searching codeword S1, while the other is set as a detecting codeword S2. This process is performed mainly by the searching code allocating unit 92. Incidentally, this embodiment features that, as described above, the codeword S1 is complementary to the codeword S2 in relation to the character string to be searched for.

Namely, it is suffice that a sum of the number of bits of the searching codeword S1 and the number of bits of the detecting codeword S2 is 24 bits in the case where the searching codeword S1 and the detecting codeword S2 are determined for the character string consisting of 24 bits to be searched for. For example, the number of bits of the searching codeword S1 is 20, and the number of bits of the detecting codeword is 4. Further, the number of bits of the searching codeword S1 is equal to the number of bits of the detecting codeword S2 and is 12. As long as the sum of the numbers of bits is 24, an arbitrary combination of the number of bits of the searching codeword S1 and the number of bits of the detecting codeword S2 may be adopted. Namely, it is suffice that the bits of the codewords S1 and S2 have a one-to-one correspondence with 24 bits of the original codeword.

In this embodiment, the number of bits of the searching codeword is set at 12, while the number of bits of the detecting codeword is set at 12. Further, in this embodiment, the characteristic portions of the original bit string are concentrated onto the searching codeword S1 as much as possible.

In the case of this embodiment, as illustrated in FIG. 9, a calculation is performed on the searching codeword S1 so that h addresses of the arrays are formed from the searching codeword S1. The contents of arrays previously entered in the remaining bit table 20 are obtained according to these h addresses. Then, the h candidates for the match, which are obtained in this way, are collated with the contents of the detecting codeword S2. If the detecting codeword S2 matches with one of the h candidates as a result of the collation, it is found that the searching character string occurred in the past. Therefore, the contents of the arrays are obtained from the index table 21 by using the operation result performed on codeword S1 as the address of the array. Furthermore, the past occurrence position of the character string is obtained from the address table 22.

In the calculating process 93, one of a multiplication and a shifting operation is performed on the searching codeword S1 obtained in the code allocating process 92, as described above. Thus, h codewords S1×h, . . . (S1+1)×(h−1) are obtained. This process is performed mainly by the calculating unit 83. For instance, in the case that "h" is 4, an operation of shifting the searching codeword S1 by 2 bits is performed, so that h codewords are obtained, as illustrated in FIG. 9.

In the array content generating process 94, the contents of the arrays Remainbit[S1×h], . . . , Remainbit[(S1+1)×h−1], are obtained from the remaining bit table 20 by using the h codewords as the addresses, at which the contents are previously entered, of the arrays. This process is performed mainly by the array content obtaining unit illustrated in FIG. 10.

In the collation process 95 (corresponding to steps R5, R5-1, R5-2 of FIG. 12), it is checked whether or not each of the array contents Remainbit[S1×h], . . . , Remainbit[(S1+1)×h−1] matches with the detecting codeword S2. This process is performed mainly by the collation unit 85.

When a match is detected in the collation process 95, namely, when Remainbit[S1×h+ord] matches with the detecting codeword S2, information on the past occurrence position of the current detecting character string is obtained by referring to the index table 21 and the address table 22 in the occurrence position information obtaining process 96. Namely, the past occurrence position Address[Index[S1]] can be obtained by referring to Index1[S1] recorded in the index table illustrated in FIG. 9.

Incidentally, although not shown in the flowchart of FIG. 12, needless to say, a step (Count-Index[S1]<$2^{12}$) of checking the recent occurrence of this character string may be provided subsequent to the step R5, similarly as in the case of the first embodiment (see the flowchart of FIGS. 8A and 8B).

The occurrence position information obtaining process 96 is performed mainly by the occurrence position information obtaining unit 86 of FIG. 10.

The encoding process 97 has a copy code generating process and a literal code generating process. Incidentally, in the copy code generating process, a codeword (a Copy codeword) designating a copy mode is outputted when the past occurrence position information of the character string according to the dictionary coding scheme is obtained. This process is performed mainly by the copy code generating portion 87a.

Incidentally, the copy code generating process subsequent to step R6 is the same as the copy code generating process (subsequent to step T6 in the flowchart of FIGS. 8A and 8B) described in the foregoing description of the first embodiment. Thus, the detailed description of the copy code generating process is omitted herein.

In the case that no match is detected in the collation process 95, a literal code is generated in the encoding process 97 from the input character string to be searched for. The generation of a literal code is performed mainly by the literal code generating portion 87b of the encoding unit 87 of FIG. 10. In the case of the flowchart of FIGS. 12A and 12B, the character Inbuf[t] at that time is outputted at step R-3.

Incidentally, the detailed description of each of the steps for generating a literal code in the flowchart of FIGS. 12A and 12B are omitted herein, because these steps are only those of an example.

As a result of providing such a process, according to the data compression method and the data compression apparatus of the second embodiment, the character search and the data compression can be performed at a high searching speed, which is nearly equal to that in the case of using the look-up table, by using a small amount of memory, which is nearly equal to that of the case of using the hash table.

Moreover, there is no necessity for collating each of characters of the character string, differently from the method using the hash table. Thus, the process of checking the presence of a match can be simplified.

Incidentally, according to the first and second embodiments of the data compression method, a relative number serving as the past occurrence position of a character string is encoded and outputted. However, the address of the input buffer Inbuf may be directly outputted. Further, the address of the input buffer may be encoded and then a codeword obtained as a consequence of the encoding may be outputted. Furthermore, in the case of these embodiments, the character string search is applied to the dictionary coding scheme. However, the present invention is not limited to the dictionary coding scheme, another suitable scheme may be used for searching for the character string.

Furthermore, although not described in the foregoing description of the first embodiment, note that a plurality of candidates for a match can be formed in the first embodiment by performing a calculation on the codeword S1 or S2.

Next, the method of generating the searching (or detecting) codeword S1 or S2, which can be used in each of the embodiments of the aforementioned, will be described hereinbelow by taking a practical example.

FIG. 13 illustrates the case that the characteristic bits of the bit string representing the character string to be searched for are evenly allocated to the searching codes S1 and S2 as much as possible. This is a method of allocating the codes, which is suitable for, especially, the first embodiment. Usually, the characteristic bits are lower-order bits. Thus, as illustrated in the figure, the searching codeword S1 are formed from the combination of even bits of the characters Inbuf[t] and Inbuf[t+2], and the odd bits of the character Inbuf[t+1]. Further, the searching codeword S2 is formed by combing the odd bits of the searching characters Inbuf[t] and Inbuf[t+2] with the even bit of the searching character Inbuf[t+1].

Thus, the searching codeword S1 includes a least significant bit (indicated by a part hatched like a checker). Further, the searching codeword S2 includes two least significant bits. Consequently, the characteristic features of the character codewords are relatively evenly distributed to the codewords S1 and S2.

FIG. 14 illustrates a method similar to the code allocating method of FIG. 13. According to this allocating method, the lowest 8 bits of the searching codes S1 and S2 are formed by alternately placing the bits of the searching characters Inbuf[t+1] and Inbuf[t+2]. The higher-order 4 bits consists of the bits of the searching character Inbuf[t]. As is apparent from this figure, the codeword S1 includes 1 least significant bit, and the codeword S2 includes 2 least significant bit. Thus, the least significant bits are prevented from being concentrated onto one of the codewords.

In the case of an example illustrated in FIG. 15, a searching code S1 is formed by combining even bits of the characters Inbuf[t] and Inbuf[t+2] to be searched for, with odd bits of the character Inbuf[t+1] to be searched for, similarly as in the case of the example illustrated in FIG. 13. In this case, the least significant bit of each of these characters is included in the codeword S1. Further, a searching code S2 is formed by combining odd bits of the characters Inbuf[t] and Inbuf[t+2] with even bits of the character Inbuf[t+1]. Similarly, in this case, the least significant bit of each of these characters is included in the codeword S2.

Thus, the 14-bit codeword S1 and the 13-bit codeword S2, which share the feature of each of the characters to be searched for, are formed.

Incidentally, the code allocating methods illustrated in FIGS. 13 and 14 are suited to the first embodiment of the present invention and may be applied to the second embodiment of the present invention. However, the method illustrated in FIG. 15 cannot be applied to the second embodiment of the present invention, because the codewords S1 and S2 are not complementary to each other (namely, the codeword S1 consists of 14 bits, while the codeword S2 consists of 13 bits).

A code allocating method illustrated in FIG. 16 is suitable for the second embodiment. Namely, the bits representing the features of characters to be searched for are concentrated onto the codeword S1 by forming the codeword S1 from the lowest 4 bits of each of the characters Inbuf[t], Inbuf[t+1] and Inbuf[t+2]. Conversely, a detecting codeword S2, which does not include the features of characters to be searched for, is generated by forming the codeword S2 from the highest 4 bits of each of the characters Inbuf[t], Inbuf[t+1] and Inbuf[t+2].

Incidentally, needless to say, the code allocating method illustrated in FIG. 16 can be applied to the first embodiment of the present invention. However, this method illustrated in FIG. 16 is not suitable for the first embodiment of the present invention.

According to the present invention, the detection of the past occurrence position of the character string, which is performed according to the dictionary coding scheme, can be achieved at a high speed in a reasonable memory area of the table. Namely, the methods of the present invention do not require the table size of a table having a one-to-one correspondence with an occurable character string, differently from the method of searching for a character string by using a look-up table. Even in the case of searching for a long character string consisting of 3 or 4 characters, the amount of memory used by a table required to search for such a character string is reduced.

Moreover, differently from the method of searching for a character string by using a hash table, the methods of the present invention do not require an operation of collating candidate a character string with a character string to be searched for, in a one-to-one relationship, and determining whether or not the candidate character string is the character string to be actually searched for. Thus, according to the present invention, an operation of checking the presence of a match is significantly simplified.

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. A data compression method for generating compressed data by performing a compression process on a data string to be compressed, comprising the steps of:

setting a plurality of consecutive characters, which are contained in the data string, as a character string to be searched;

allocating bits of a bit string representing said character string to two codewords to thereby generate a first searching codeword and a second searching codeword that is a complementary codeword to said first searching codeword;

obtaining an array content from a first array table, in which said second codeword relating to past occurred character strings is previously stored, by using said first searching codeword relating to the set character string to be searched at present as an array address;

collating the obtained array content with said second codeword; and obtaining information on past occurrence positions of said set character string from a second array table, in which past occurrence positions of character strings are previously entered, by using said first codeword as an array address when the array content matches with said second codeword.

2. The data compression method according to claim 1, further comprising a step of encoding and outputting said obtained occurrence position information.

3. The data compression method according to claim 2, wherein the step of encoding comprises the steps of:

outputting a copy code when the information on the past occurrence position of said character string is obtained in the step of obtaining information on past occurrence positions; and outputting a literal code when the information on the past occurrence position of said character string is not obtained in the step of obtaining information on past occurrence positions.

4. The data compression method according to claim 3, wherein the step of outputting a copy code comprises the steps of:

obtaining information on a length of a character string, which follows said set character string and continuously matches with contents of an array corresponding to addresses following a starting point that is an occurrence position of said set character string obtained in the step of obtaining occurrence position information, as match length information; and encoding and outputting said past occurrence position information and said match length information.

5. The data compression method according to claim 3, wherein the step of outputting a literal code comprises the step of outputting a literal indicating code with input data, which represents a leading character of said set character string, without change or a code obtained by encoding said input data.

6. The data compression method according to claim 1, wherein said first searching codeword comprises a plurality of lower-order bits of bit strings representing characters of said set character string, and wherein said second searching codeword comprises higher-order bits, whose orders are higher than said lower-order bits, of said bit strings.

7. A data compression method for generating compressed data by performing a compression process on a data string to be compressed, comprising the steps of:
   setting a plurality of consecutive characters, which are contained in the data string, as a character string to be searched,
   allocating bits of a bit string representing said character string to two codewords to thereby generate first searching codeword and a second searching codeword that is a complementary codeword to said first searching codeword;
   performing an operation on said first codeword and obtaining a plurality of codewords whose starting point is an operation result conducted on said first codeword;
   obtaining a plurality of array contents from a first array table, in which said second codeword relating to past occurred character strings is previously stored, by using said obtained plurality of codewords relating to the set character string to be searched at present as array addresses;
   collating the obtained plurality of array contents with said second codeword; and
   obtaining information on past occurrence positions of said set character string from a second array table, in which past occurrence positions of character strings are previously entered, by using said codewords obtained as a result of said operation as an array address when the array content matches with said second codeword.

8. The data compression method according to claim 7, wherein said operation at the step of performing an operation is one of a multiplication and a shifting operation.

9. The data compression method according to claim 7, further comprising a step of encoding and outputting said obtained occurrence position information.

10. The data compression method according to claim 9, wherein the step of encoding comprises the steps of:
   outputting a copy code when the information on the past occurrence position of said character string is obtained in the step of obtaining information on past occurrence positions; and
   outputting a literal code when the information on the past occurrence position of said character string is not obtained in the step of obtaining information on past occurrence positions.

11. The data compression method according to claim 10, wherein the step of outputting a copy code comprises the steps of:
   obtaining information on a length of a character string, which follows said set character string and continuously matches with contents of an array corresponding to addresses following a starting point that is an occurrence position of said set character string obtained in the step of obtaining occurrence position information, as match length information; and
   encoding and outputting said past occurrence position information and said match length information.

12. The data compression method according to claim 10, wherein the step of outputting a literal code comprises the step of outputting a literal indicating code with input data, which represents a leading character of said set character string, without change or a code obtained by encoding said input data.

13. The data compression method according to claim 7, wherein said first searching codeword comprises a plurality of lower-order bits of bit strings representing characters of said set character string, and wherein said second searching codeword comprises higher-order bits, whose orders are higher than said lower-order bits, of said bit strings.

14. A data compression apparatus for generating compressed data by performing a compression process on a data string to be compressed, comprising:
   character string setting unit for setting a plurality of consecutive characters, which are contained in the data string, as a character string to be searched;
   searching code allocating unit for allocating bits of a bit string representing said character string to two codewords to thereby generate a first searching codeword and a second searching codeword that is a complementary codeword to said first searching codeword;
   array content obtaining unit for obtaining an array content from a first array table, in which said second codeword relating to past occurred character strings is previously stored, by using said first searching codeword relating to the set character string to be searched at present as an array address;
   collation unit for collating the obtained array content with said second codeword; and
   occurrence position obtaining unit for obtaining information on past occurrence positions of said set character string from a second array table, in which past occurrence positions of character strings are previously entered, by using said first codeword as an array address when the array content matches with said second codeword.

15. The data compression apparatus according to claim 14, further comprising encoding unit for encoding and outputting said obtained occurrence position information.

16. The data compression apparatus according to claim 15, wherein said encoding unit comprises:
   a copy code generating unit for outputting a copy code when the information on the past occurrence position of said character string is obtained in said occurrence position information obtaining unit; and
   a literal code generating unit for outputting a literal code when the information on the past occurrence position of said character string is not obtained in said occurrence position information obtaining unit.

17. The data compression apparatus according to claim 11, wherein said copy code generating unit comprises:
   a match length calculating unit for obtaining information on a length of a character string, which follows said set character string and continuously matches with contents of an array corresponding to addresses following a starting point that is an occurrence position of said set character string obtained in the step of obtaining occurrence position information, as match length information; and
   an encoding/outputting unit for encoding and outputting said past occurrence position information and said match length information.

18. The data compression apparatus according to claim 16, wherein said literal code generating unit comprises unit for outputting a literal indicating code with input data, which represents a leading character of said set character string, without change or a code obtained by encoding said input data.

19. A data compression apparatus for generating compressed data by performing a compression process on a data string to be compressed, comprising the steps of:

character string setting unit for setting a plurality of consecutive characters, which are contained in the data string, as a character string to be searched, searching code allocating unit for allocating bits of a bit string representing said character string to two codewords to thereby generate a first searching codeword and a second searching codeword that is a complementary codeword to said first searching searched;

operation unit for performing an operation on said first codeword and obtaining a plurality of codewords whose starting point is said first codeword;

array content obtaining unit for obtaining a plurality of array contents from a first array table, in which said second codeword relating to past occurred character strings is previously stored, by using said obtained plurality of codewords relating to the set character string to be searched at present as array addresses;

collation unit for collating the obtained plurality of array contents with said second codeword; and occurrence position information obtaining unit for obtaining information on past occurrence positions of said set character string from a second array table, in which past occurrence positions of character strings are previously entered, by using said codewords obtained as a result of said operation as an array address when the array content matches with said second codeword.

20. The data compression apparatus according to claim 19, wherein said operation performed by said operation unit is one of a multiplication and a shifting operation.

21. The data compression apparatus according to claim 19, further comprising encoding unit for encoding and outputting said obtained occurrence position information.

22. The data compression apparatus according to claim 21, wherein said encoding unit comprises:

a copy code generating unit for outputting a copy code when the information on the past occurrence position of said character string is obtained in said occurrence position information obtaining unit; and a literal code generating unit for outputting a literal code when the information on the past occurrence position of said character string is not obtained in said occurrence position information obtaining unit.

23. The data compression apparatus according to claim 22, wherein said copy code generating unit comprises:

match length calculating unit for obtaining information on a length of a character string, which follows said set character string and continuously matches with contents of an array corresponding to addresses following a starting point that is an occurrence position of said set character string obtained in the step of obtaining occurrence position information, as match length information; and encoding/outputting unit for encoding and outputting said past occurrence position information and said match length information.

24. The data compression apparatus according to claim 22, wherein said literal code generating unit comprises unit for outputting a literal indicating code with input data, which represents a leading character of said set character string, without change or a code obtained by encoding said input data.

* * * * *

UNITED STATES PATENT AND TRADEMARK OFFICE
CERTIFICATE OF CORRECTION

PATENT NO. : 6,876,774 B2
DATED : April 5, 2005
INVENTOR(S) : Noriko Satoh et al.

It is certified that error appears in the above-identified patent and that said Letters Patent is hereby corrected as shown below:

Title page,
Item [56], References Cited, OTHER PUBLICATIONS, change "Williams, Ross N., "An xtremely Fas ZIV-Lampel Data compression Algorithm", pp. 362-371, 1991" to -- Williams, Ross N., "An Extremely Fast ZIV-Lampel Data Compression Algorithm", pp. 362-371, 1991 --.

Column 17,
Line 20, after "generate" insert -- a --.

Column 18,
Line 55, change "11" to -- 16 --.

Signed and Sealed this

Seventh Day of February, 2006

JON W. DUDAS
*Director of the United States Patent and Trademark Office*